(12) United States Patent
Kuriyama et al.

(10) Patent No.: US 6,544,585 B1
(45) Date of Patent: Apr. 8, 2003

(54) METHOD AND APPARATUS FOR PLATING A SUBSTRATE

(75) Inventors: Fumio Kuriyama, Yokohama (JP); Akihisa Hongo, Yokohoma (JP); Hiroaki Inoue, Machida (JP); Tsuyoshi Tokuoka, Fujisawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/145,500

(22) Filed: Sep. 2, 1998

(30) Foreign Application Priority Data

| Sep. 2, 1997 | (JP) | 9-252758 |
| Sep. 11, 1997 | (JP) | 9-265027 |
| Sep. 12, 1997 | (JP) | 9-267854 |
| Sep. 16, 1997 | (JP) | 9-269300 |
| Sep. 16, 1997 | (JP) | 9-269305 |
| Nov. 19, 1997 | (JP) | 9-334902 |

(51) Int. Cl.$^7$ ................................. B05D 5/12
(52) U.S. Cl. ................ 427/97; 427/294; 427/304; 427/437; 427/443.1
(58) Field of Search .............. 427/97, 98, 437, 427/443.1, 294, 304; 95/249–252

(56) References Cited

U.S. PATENT DOCUMENTS

| 4,619,887 A | | 10/1986 | Hooper et al. |
| 5,011,793 A | * | 4/1991 | Obinata ............... 437/203 |
| 5,077,099 A | * | 12/1991 | Kukanskis et al. ......... 427/437 |
| 5,368,634 A | * | 11/1994 | Hackett ................ 95/260 |
| 5,529,954 A | | 6/1996 | Iijima et al. |
| 6,139,712 A | | 10/2000 | Patton et al. |

FOREIGN PATENT DOCUMENTS

| EP | 0 724 292 | 7/1996 |
| EP | 0 880 168 | 11/1998 |
| JP | 1-240694 | 9/1989 |
| JP | 3-211287 | 9/1991 |
| JP | 29643 | * 2/1994 |
| JP | 6-29643 | 2/1994 |
| JP | 8-32205 | 2/1996 |
| JP | 63-277771 | 11/1998 |
| WO | 99/25905 | 5/1999 |
| WO | 00/32835 | 6/2000 |

OTHER PUBLICATIONS

Translation of Japanese Laid–Open Patent publication No. 6–29643.
Patent Abstracts of Japan, vol. 016, No. 263 (D–1216), Jun. 15, 1992 & JP 04 061125 A (Kanegafuchi Chem. Ind. Co. Ltd.), Feb. 27, 1992 * abstract *.
Pei–Lin Pai et al.: Selective Electroless Copper for FLSI Interconnection: IEEE Electron Device Letters, vol. 10, No. 9, Sep. 1, 1989, pp. 423–425, XP000087701 * the whole document *.
Patent Abstracts of Japan, vol. 018, No. 480 (E–1603), Sep. 8, 1994 & JP 06 164140 A (Ibiden Co. Ltd.), Jun. 10, 1994 * abstract *.
Minamihaba G. et al.: "Double–Level CU Inlaid Interconnects with Simultaneously Filled Viaplugs" Japanese Journal of Applied Physics, vol. 35, No. 2B, Feb. 1, 1996, pp. 1107–1110, XP000701030 * the whole document *.
Patent Abstracts of Japan, vol. 012, No. 337 (E–657), Sep. 12, 1988 & JP 63 100749 A (Hitachi Ltd.), May 2, 1988 * abstract *.

* cited by examiner

*Primary Examiner*—Brian K. Talbot
(74) *Attorney, Agent, or Firm*—Wenderoth, Lind & Ponack, L.L.P.

(57) ABSTRACT

A high quality metallic deposit can be produced inside the micro-cavities formed on a surface of a substrate by the present invention. The method involves immersing the substrate in a liquid held in a processing chamber, evacuating the processing chamber so as to remove residual bubbles from the micro-cavities and to degas the liquid within the micro-cavities, and subjecting the liquid to boiling in at least those regions adjacent to the substrate.

33 Claims, 29 Drawing Sheets

F I G. 1
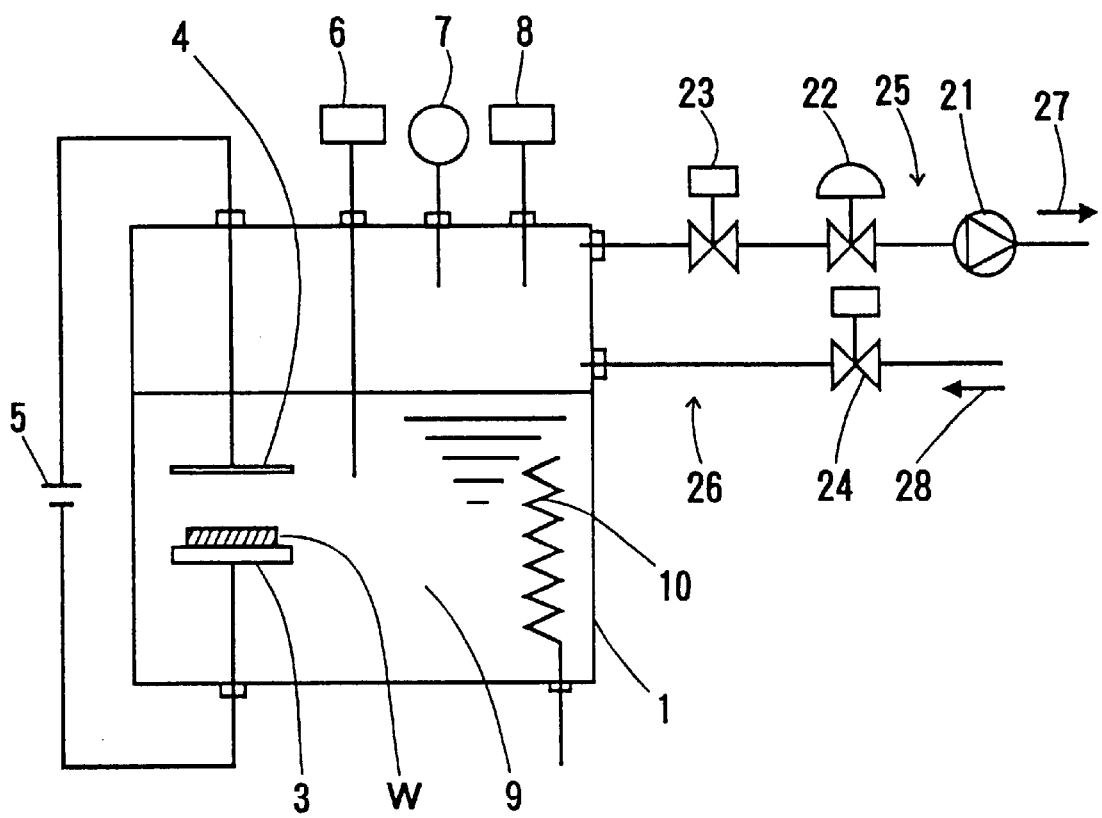

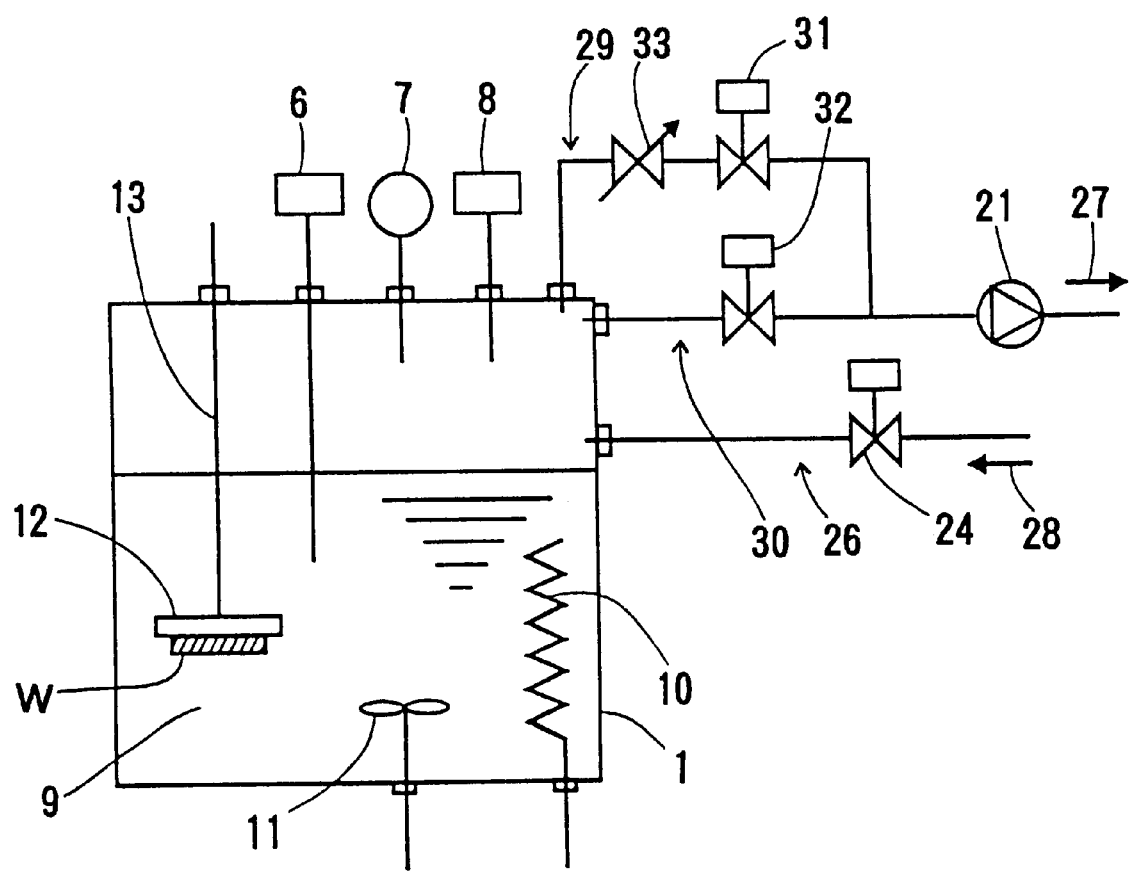
F I G. 7

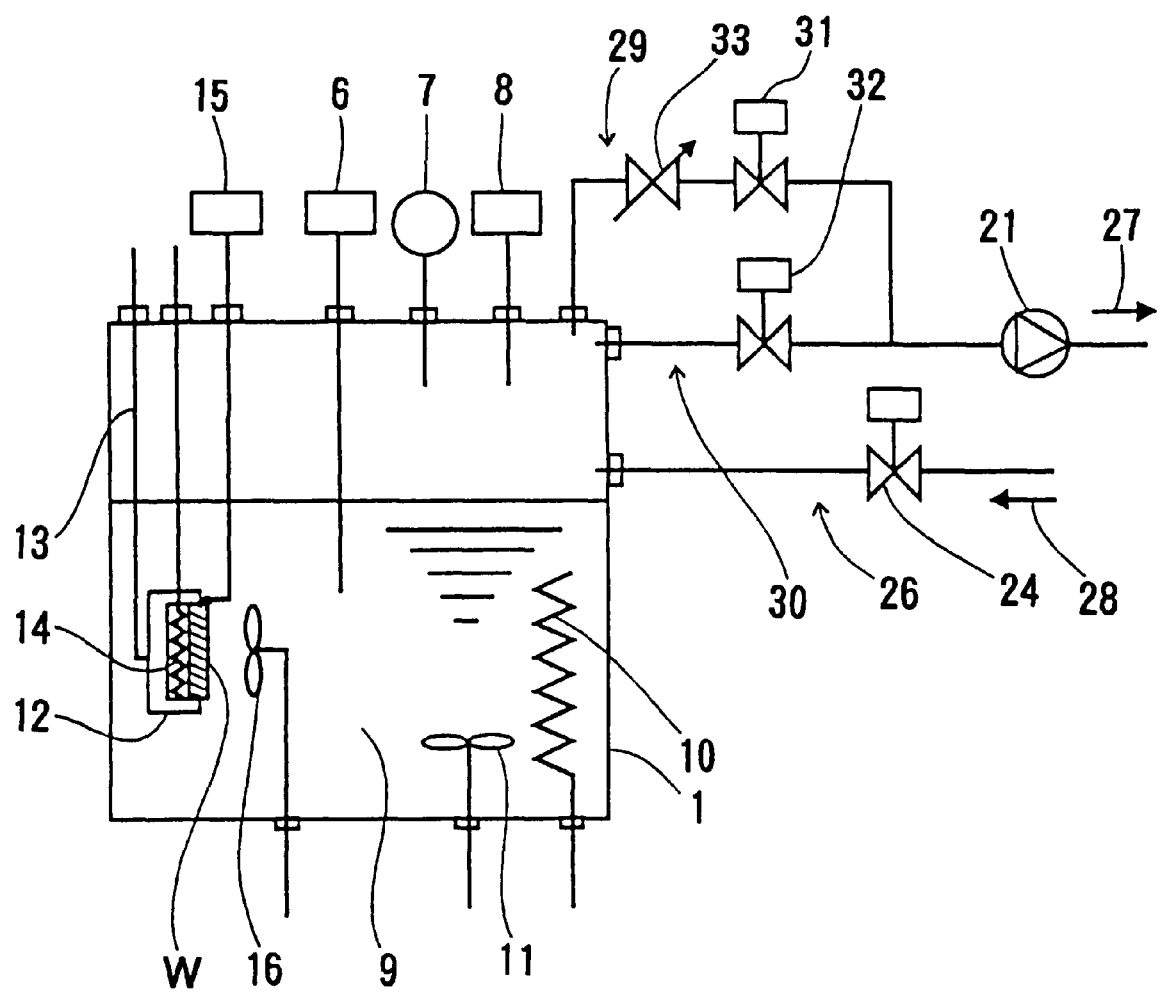
F I G. 1 1

F I G. 12
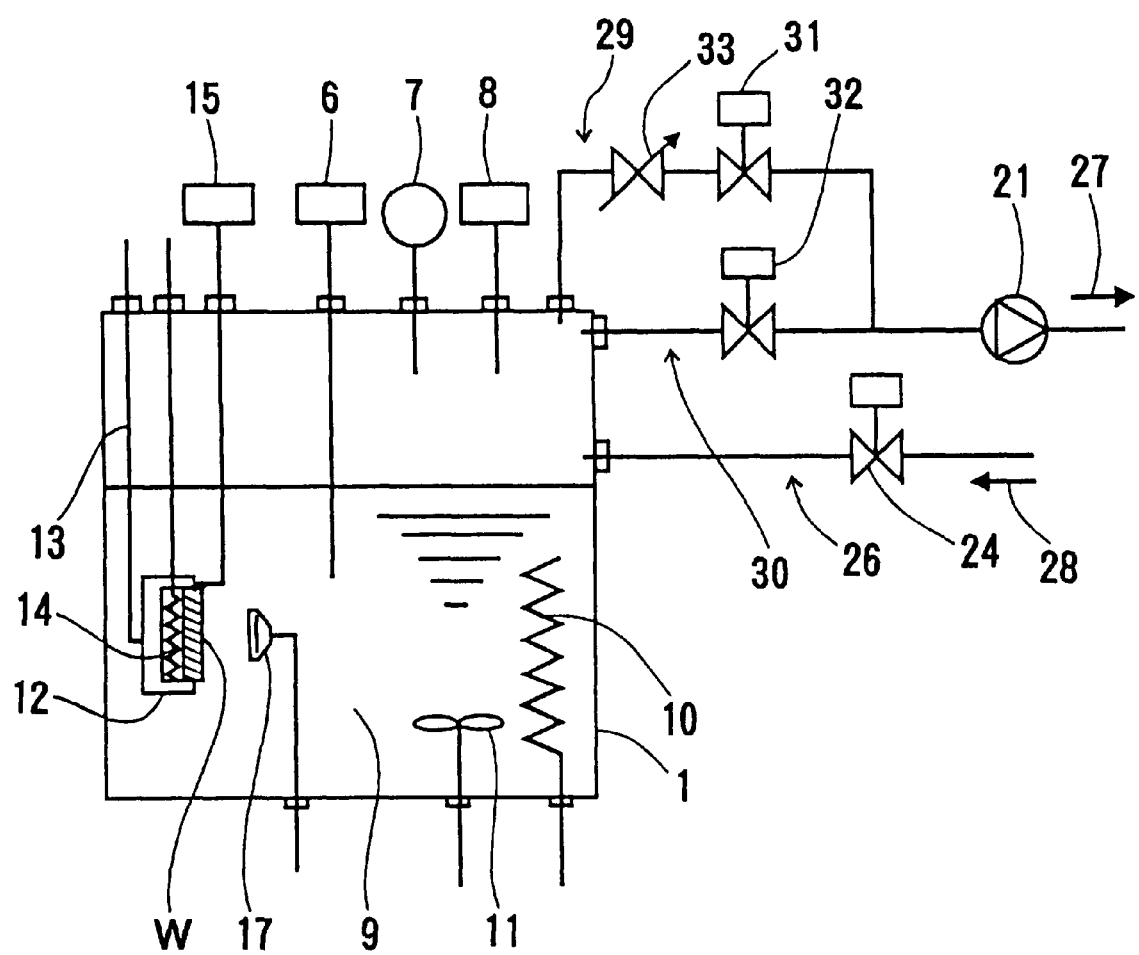

F I G. 1 3
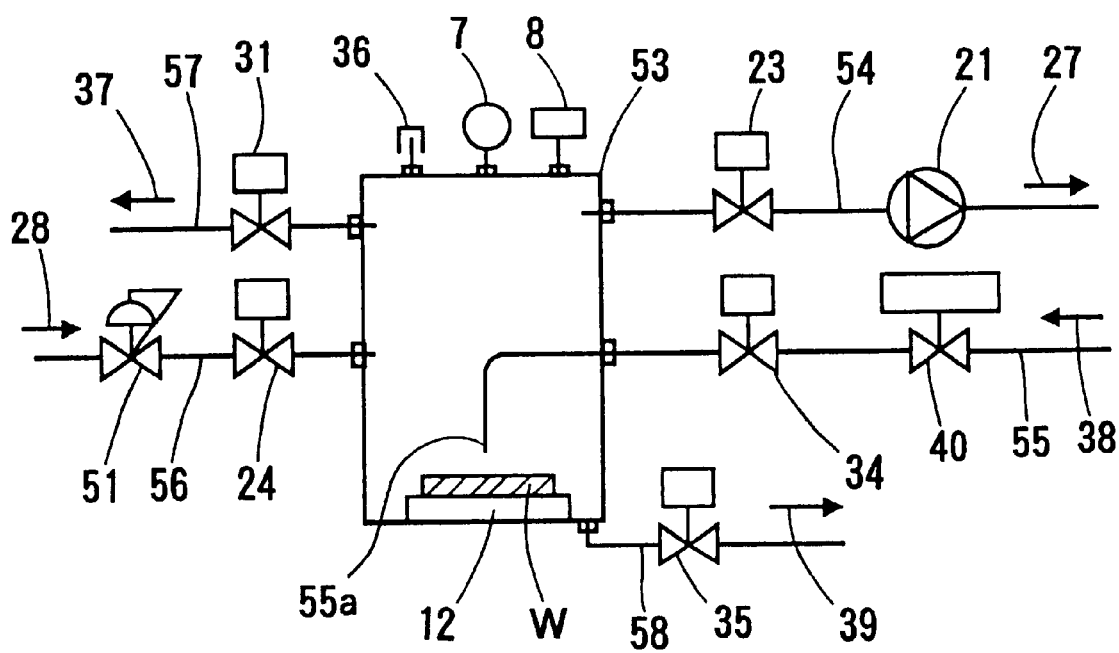

F I G. 16
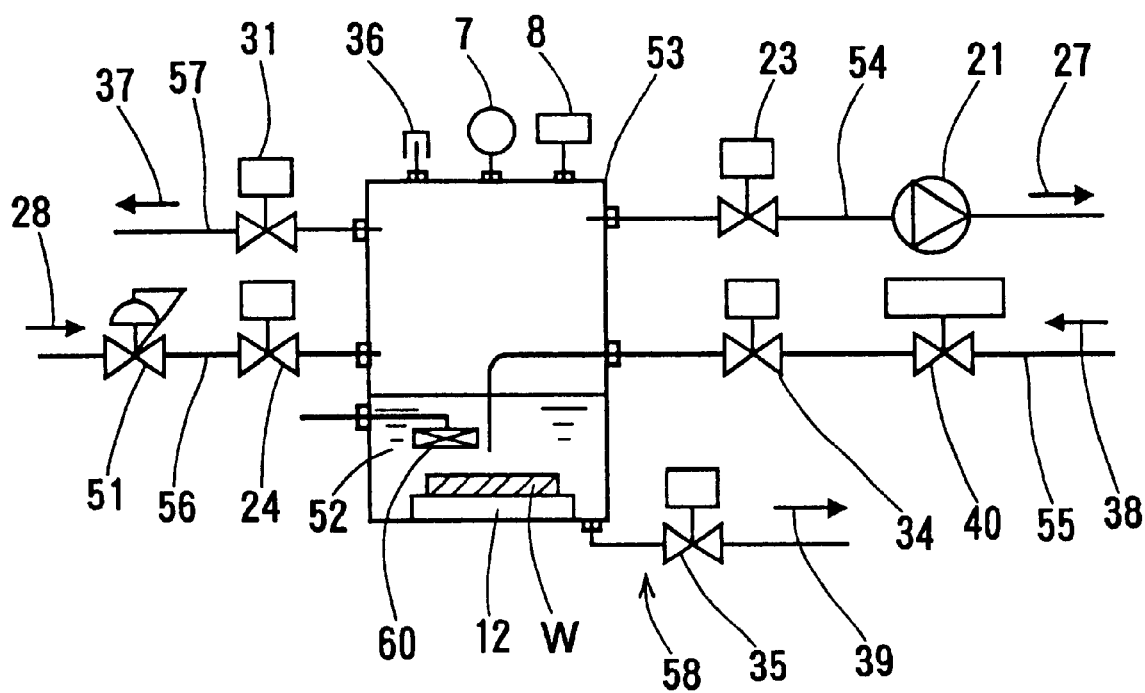

F I G. 2 1
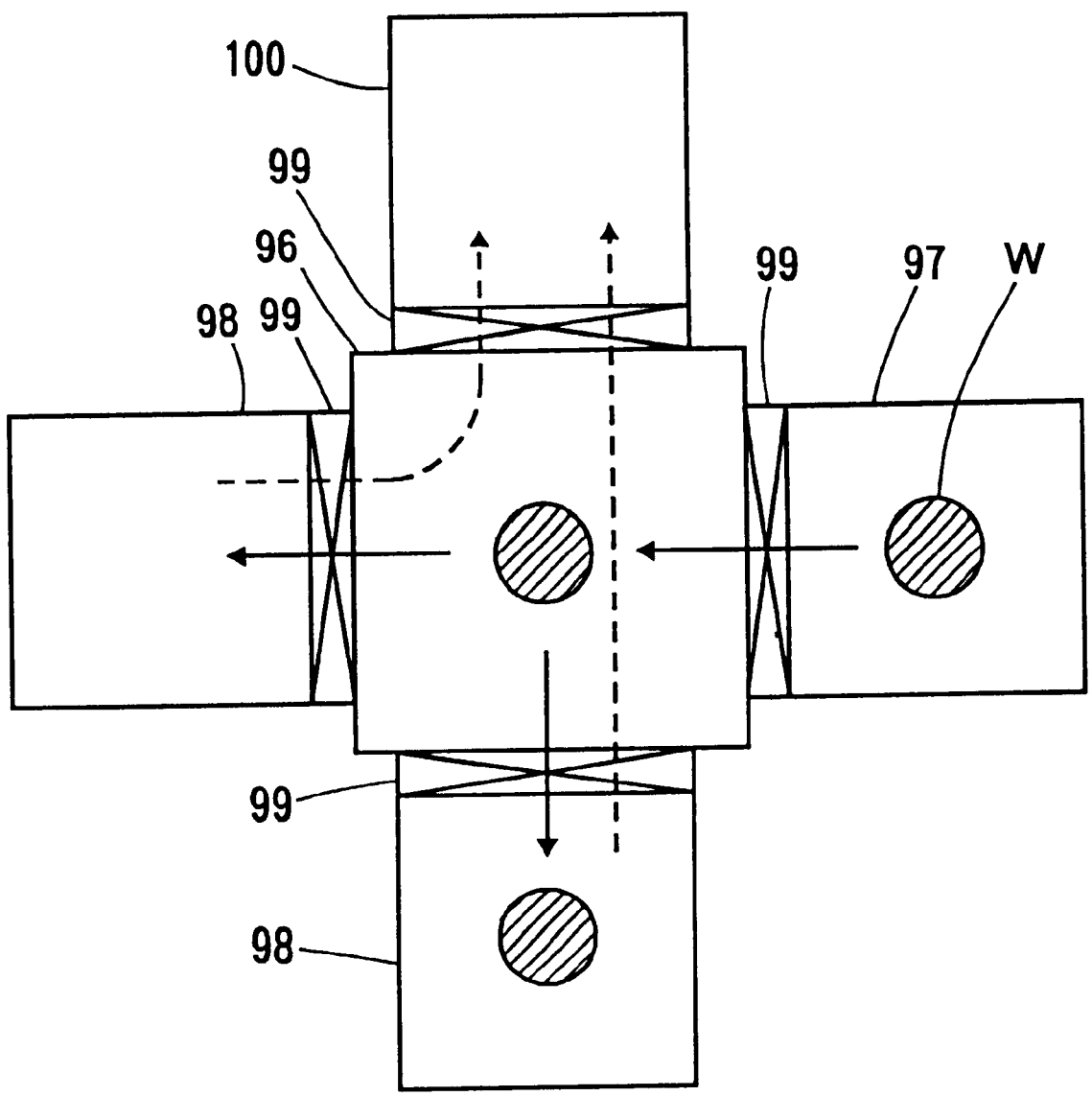

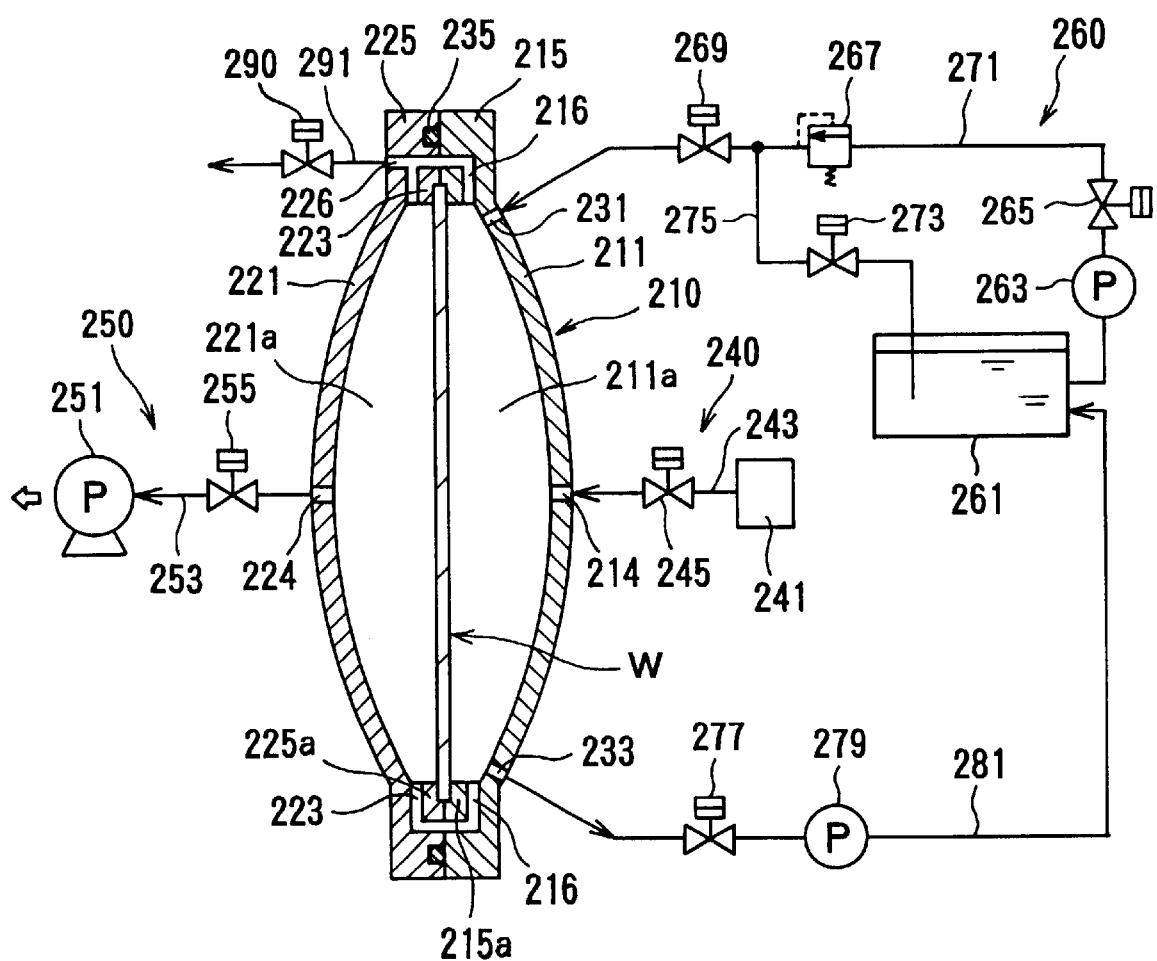
F I G. 24

F I G. 2 8
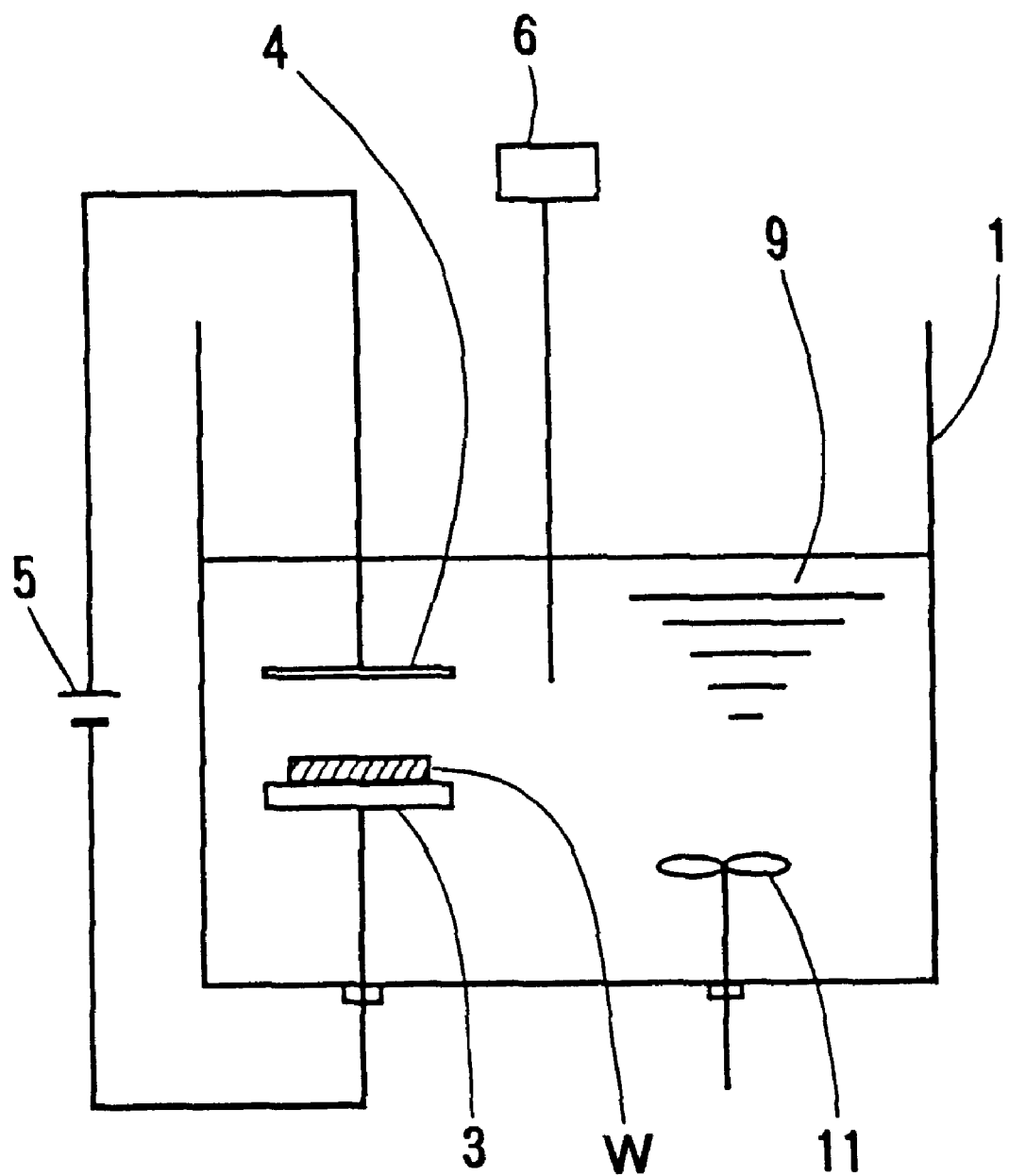

METHOD AND APPARATUS FOR PLATING A SUBSTRATE

BACKGROUND OF THE INVENTION

1. Field of the Invention

The present invention relates in general to next generation technology for fabricating electrical interconnects in integrated circuit devices, and relates in particular to a method and apparatus for filling micro-cavities formed on a surface of a substrate with metal plating.

2. Description of the Related Art

Aluminum is a typical material used for fabricating conductor circuit patterns in integrated semiconductor devices. An aluminum conductor line pattern is fabricated by first sputtering an aluminum film on a semiconductor wafer (wafer), followed by forming circuit patterns on the aluminum film by means of photolithography, and etching off unwanted regions to complete the conductor line pattern. As the devices become more highly integrated, there have been increasing demands for a finer conductor line pattern. Referring to FIGS. 27A–27C, to meet such demands for micro-fabrication, the width of grooves 303 and contact hole 301 for producing conductor line 311 and plug 313 must be made smaller, typically in a range of 0.13 to 0.18 μm. When the width of the conductor line becomes so narrow, aluminum begins to show problems due to its inferior properties.

To other types of metals than aluminum, the above-described conventional method of circuit fabrication is sometimes difficult to apply, and therefore, a damascene process has been performed by fabricating stud holes and wiring cavities on a circuit board first, and then filling the cavities with a suitable metal by using processes such as chemical vapor deposition (CVD), sputtering or plating, and finishing the circuit board by chemical mechanical polishing (CMP) to complete conductor line fabrication.

Plating has been used widely for forming metallic films and has many advantages. FIG. 28 shows a setup for conventional plating. A plating chamber 1 contains a plating solution 9 in which are immersed a cathode 3, having a substrate W, and an opposing anode 4, and the plating solution 9 is stirred with a stirrer 11 during plating.

Compared to other processes, the plating cost is relatively low, high purity products can be produced, and processes can be done at a relatively low temperature to avoid degrading thermal effects. However, it is difficult to use plating to fill micro-cavities C such as grooves 303 and contact holes 301 without leaving some internal voids. When a substrate W having micro-cavities C is immersed in plating solution 9, it is not unusual to have residual air remaining inside the cavities C, and it is not possible to infiltrate the cavities C completely with the plating solution 9. This is considered to be due to the effects of wettability of the substrate W and the surface tension force of plating solution 9, and, especially for such shapes as the contact hole 301, which is deeper than it is wide (for example, an aspect ratio, depth/width, of about 5), air tends to remain in the cavity much more frequently. Similarly, it becomes much more difficult to displace spent liquid of plating solution 9 with fresh plating solution containing active metallic ions. This difficulty increases as the width of the cavities C becomes narrower.

SUMMARY OF THE INVENTION

It is an object of the present invention to provide a method and an apparatus for plating to enable a high quality metallic deposit to be produced inside the micro-cavities formed on a surface of a substrate, such as a semiconductor wafer, by completely infiltrating the micro-cavities with a plating solution and refreshing the plating solution in the micro-cavities during plating.

The present invention is to establish such an object by a method for producing a metal deposit inside micro-cavities fabricated on a substrate comprising: immersing the substrate in a liquid held in a processing chamber; evacuating the processing chamber so as to remove residual bubbles from the micro-cavities and to degas the liquid within the micro-cavities; and subjecting the liquid to boiling in at least those regions adjacent to the substrate.

Accordingly, after removing the gas dissolved in the liquid or residual bubbles from the micro-cavities utilizing a phenomenon of nucleate boiling, the plating solution is infiltrated into the cavities so that metal can be plated inside of the cavities to efficiently produce a high quality deposit which is free of internal defects. This process is basically applicable to both electro- and electroless-plating processes.

The liquid may comprise a plating solution so that plating can be readily performed. In another option, a preferred liquid other than a plating solutions which is more easily introducible to the micro-cavities is usable. Such liquid may include water, alcohol or another suitable liquid. In this case, replacing or diluting the liquid with a plating solution may be necessary prior to plating.

The processing chamber may be a plating chamber so that the plating process can be done without transferring the substrate. In another option, the processing chamber may be made as a pre-plating processing chamber only for the pre-plating process.

In the boiling step, interior chamber pressure may be reduced to a value less than a saturated vapor pressure of the liquid. This will lower the boiling point of the liquid so that there is no need to raise the temperature of the liquid to a high temperature, thus resulting in an energy efficient and productive plating process. In the boiling step, the substrate may be heated from a back surface of the substrate. This will promote selective heating of those regions close to the cavities so that expelling of bubbles from the cavities and boiling in the cavities are enhanced. In the boiling step, interior chamber pressure may be reduced and at the same time, the substrate may be heated from the back surface.

Between a degassing step and a boiling step, interior chamber pressure may be raised to a high pressure. Also, boiling and pressurizing may be repeatedly carried out. These steps will enable the solution to reliably infiltrate the cavities, and to replace the solution inside the cavities periodically with fresh solution, thereby realizing defect-free plating.

It is also permissible to perform a boiling step while plating. Boiling may be carried out intermittently or continuously. This will enable to carry out plating while exchanging old plating solution inside the cavities with fresh plating solution to efficiently carry out the process of depositing metal in the cavities.

In another aspect of the invention, an apparatus for producing a metal deposit inside micro-cavities fabricated on a substrate comprises a sealable processing chamber; an evacuating device for reducing interior chamber pressure; and a gas inlet device for pressurizing the chamber interior. The evacuating device is capable of selectively reducing interior chamber pressure to at least two pressure values, one being less than a saturated vapor pressure of the liquid, and the other being an intermediate value between the saturated vapor pressure and atmospheric pressure.

In this apparatus, liquid such as plating solution in the chamber, air, dissolved gas or gas bubbles in the plating solution, and bubbles attaching to the substrate can be made to undergo volume change or changes in their liquid state, so that liquid may be infiltrated into the cavities and/or the old solution may be refreshed with new solution. This will permit to form a metal deposit within the cavities efficiently by plating, without creating internal defects in the deposited metal. A heating device to heat the plating solution may be provided to facilitate the liquid filtration or to raise plating efficiency.

The evacuating device may have an exhaust pipe to connect a vacuum pump for reducing interior chamber pressure, and the exhaust pipe may be provided with a shutoff valve and a control valve for adjusting flow resistance. This will permit the system to be switched between two vacuum levels: a pressure intermediate between one atmosphere and the saturated vapor pressure; and a saturated vapor pressure or lower. Such a switching operation will enhance degassing of dissolved gas in the liquid by reduced pressure and expelling bubbles from the cavities by volume expansion on the one hand, and vapor release due to nucleate boiling in the cavities prompted by a high vacuum.

The evacuating device may have a vacuum pump to reduce interior chamber pressure and two parallel exhaust pipings having different flow resistance to connect the vacuum pump to the plating chamber.

The apparatus may be provided with a heating device for heating the substrate through a back surface of the substrate.

The apparatus may be provided with a vibrator means for stirring the plating solution in the plating chamber. These are all effective means for promoting liquid boiling in the cavities.

In another aspect of the invention, a method for fabricating wiring on a substrate comprises: immersing the substrate in a liquid in a processing chamber; evacuating the processing chamber so as to remove residual bubbles from the micro-cavities and to degas the liquid within the micro-cavities; subjecting the liquid to boiling in at least those regions adjacent to the substrate; plating the substrate so as to produce a metal deposit inside the micro-cavities; and removing unwanted portions of metal deposit formed in the micro-cavities by polishing using chemical and mechanical polishing methods.

The liquid may be a plating solution so that plating can be readily performed, or, a preferred liquid other than a plating solution easily introducible to the micro-cavities. In this case, a step for replacing or diluting the liquid with a plating solution is necessary between the boiling and plating steps.

In another aspect of the invention, an apparatus for producing a metal deposit inside micro-cavities fabricated on a substrate comprises: a sealable processing chamber; a vacuum device for reducing interior chamber pressure; a substrate holder for holding the substrate in such a way that a back surface side of the substrate is liquid-tight in the processing chamber; and a heater provided internally in the substrate holder for heating the substrate.

In another aspect of the invention, a method for producing a metal deposit inside micro-cavities fabricated on a substrate comprises: placing the substrate in a sealable processing chamber; evacuating the interior of the chamber; immersing the substrate in a liquid; and pressurizing the liquid surrounding the substrate.

Accordingly, after exhausting the non-condensable gases such as air from the surface of the substrate, a liquid is introduced into the chamber at normal temperature and pressure, and when the substrate is immersed in the liquid, the surface of the substrate touches the liquid. Although the cavities may contain bubbles formed by a vapor of the liquid because of surface tension effects, the application of pressure will destroy the bubbles and replace the cavities with infiltrated liquid.

The method may include a step of providing a pressure variation to the liquid surrounding the substrate. This will further enhance infiltration of liquid into the cavities. Such liquid may include water, alcohol or a plating solution or a mixture thereof. Selection is made by considering wettability of the substrate by the liquid and compatibility with the plating process to follow.

In the immersing step, a surface active agent may be used to improve wettability of the substrate. This will enhance wettability and facilitate infiltration of liquid into the cavities. Such agents may be added to the liquid beforehand, but the agent itself may be introduced first into the chamber to improve the wettability of the cavity surface, and then the liquid may be infiltrated into the cavities.

In another aspect of the invention, an apparatus for producing a metal deposit inside micro-cavities fabricated on a substrate comprises a sealable processing chamber; a vacuum exhaust passage for evacuating the processing chamber; a liquid inlet passage for supplying a liquid to the processing chamber; a gas inlet passage for pressurizing the liquid in the processing chamber; and a gas discharge passage for discharging gas from the processing chamber.

Substrates may be processed in a group or one at a time. A liquid draining passage is useful to facilitate the processing steps. The apparatus may be shared for both pre-plating treatment and plating processes. A plurality of liquid inlet passages may be provided to enable introducing different types of liquids or surfactants continuously or concurrently.

The apparatus may be provided with a pressure varying device to produce pressure changes in the processing chamber. The pressure varying device may be a shutoff valve or a switching valve provided on at least one of the gas inlet passage or the degassing passage.

The pressure varying device may be an ultrasonic vibrator device.

In another aspect of the invention, a method for producing a metal deposit inside micro-cavities fabricated on a substrate comprises: placing the substrate in a sealable processing chamber; charging the processing chamber with a condensable gas; and cooling the substrate to a temperature lower than a dew point of the condensable gas to form droplets thereof within the micro-cavities.

This will allow droplets to form on the surface of the cavities and attach to the inside of the cavities. Therefore, by immersing the substrate in this condition, the plating solution replaces the droplets and infiltrates the cavities by affiliating with the droplets of the condensable gas.

The method may include a step of vibrating the substrate. Cooling the substrate to below the dew point of the condensable gas does not always produce droplets. This is because the condensable gas may be in a supercooled state and remain in the gaseous state. The degree of supercooling temperature is not a constant value, and it can sometimes reach a very high value. Therefore, by vibrating the substrate, the supercooled condition of the gas inside the cavities is disturbed, thereby releasing the gas from the supercooled state and reliably forming droplets inside the cavities.

In the charging step, the charging pressure of the condensable gas may be varied. This will permit replacing the residual bubbles in the cavities with condensable gas and reliabiltity forming droplets by cooling. The environment may be evacuated first and then filled with a condensable gas so as to facilitate replacement of the residual gas in the cavities with condensable gas and to reliably form droplets by cooling.

The method may include a step of immersing the substrate in a liquid. In this case, the liquid may be degassed by subjecting the liquid to boiling or evacuating so as to avoid a formation of bubbles from the dissolved air in the liquid. The liquid for immersing the substrate is preferably a liquid having a smaller surface tension than water so as to reliably infiltrate the cavities with the liquid. The liquid may be a plating solution, then the pre-treatment process may be continued into a plating process.

In another aspect of the invention, an apparatus for producing a metal deposit inside micro-cavities fabricated on a substrate comprises: a sealable processing chamber; a gas inlet device for introducing a condensable gas into the processing chamber; a substrate cooling device for cooling the substrate; and a liquid supply device for supplying a liquid into the processing chamber.

This apparatus enables forming droplets on the inside surfaces of the cavities and condensing continuously. Further, a vacuum device may be provided to evacuate the processing chamber. Using this apparatus, residual gas in the cavities may be replaced with a condensable gas, and by cooling, droplets can be reliably formed in the cavities. Further, a gas inlet device may be provided to pressurize the processing chamber, thereby enabling reliable infiltration of the cavities with the liquid.

A method for producing a metal deposit inside micro-cavities fabricated on a substrate, comprises heating the substrate while exposing the micro-cavities to a liquid so as to expand and expel residual bubbles from the micro-cavities to thereby infiltrate the micro-cavities with the liquid.

In this case, a heating step may be accompanied by a cyclic pressure variation in a range above atmospheric pressure such that pressurizing and returning to atmospheric pressure are repeated.

The liquid may be first pressurized during the heating step and then is returned to atmospheric pressure to thereby facilitate expelling of the residual bubbles from the micro-cavities. The liquid may be a plating solution.

In another aspect of the invention, a method for producing a metal deposit inside micro-cavities fabricated on a substrate comprises: disposing the substrate in a pressure vessel so that both surfaces of the substrate are under an identical pressure; evacuating the pressure vessel so as to expel residual bubbles from the micro-cavities; and introducing a liquid in the pressure vessel and applying a pressure so as to infiltrate the liquid into the micro-cavities.

In another aspect of the invention, a method for producing a metal deposit inside micro-cavities fabricated on a substrate comprises: disposing the substrate in a pressure vessel so that both surfaces of the substrate are under an identical pressure; charging the pressure vessel with a gas having a solubility in a liquid; introducing the liquid into the pressure vessel; and pressurizing the liquid so as to forcibly dissolve residual bubbles of the gas in the micro-cavities into the liquid to thereby infiltrate the liquid into the micro-cavities.

BRIEF DESCRIPTION OF THE DRAWINGS

FIG. 1 is a schematic diagram of a plating apparatus of the present invention;

FIG. 7 is a second embodiment of the plating apparatus of the present invention;

FIG. 11 is a fifth embodiment of the plating apparatus of the present invention;

FIG. 12 is a sixth embodiment of the plating apparatus of the present invention;

FIG. 13 is a schematic drawing of a pre-plating treatment apparatus of the present invention;

FIG. 16 is a schematic illustration of another embodiment of the pre-plating treatment apparatus;

FIG. 21 is a schematic illustration of another embodiment of the pre-plating treatment apparatus;

FIG. 24 is an overall schematic view of another embodiment of the plating apparatus for a semiconductor wafer;

FIG. 28 is a schematic diagram of a conventional plating apparatus; and

DESCRIPTION OF THE PREFERRED EMBODIMENTS

Figure 2A:
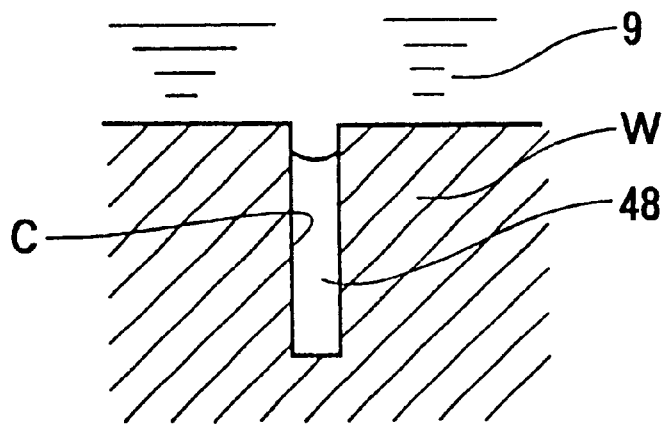
FIG. 2 is a conceptual illustration of an air-removal mechanism for residual air from micro-cavities by pressure reduction.

FIG. 1 is a schematic drawing of an electroplating apparatus of the present invention. A plating chamber 1 is an air-tightly closable vessel having a cathode 3 with a substrate W and an anode 4 which are both connected to an electrical power source 5. Plating chamber 1 is provided with a temperature sensor 6 for detecting the temperature of the plating solution 9, and a chamber liquid heater 10, which is controlled by a temperature controller (not shown) according to output data from the temperature sensor 6 to maintain the plating solution 9 at a specific constant temperature.

Plating chamber 1 is connected by an exhaust pipe 25 having a shutoff valve 23 and a flow control valve 22 to a vacuum pump 21, thereby enabling selectively maintaining the pressure inside the chamber 1 at a vacuum less than the saturated vapor pressure of the plating solution or a pressure intermediate between atmospheric pressure and the saturated vapor pressure. Plating chamber 1 is also connected to a gas supply source (not shown) through a gas inlet pipe 26 so as to keep the interior chamber pressure at or above the atmospheric pressure. Interior pressure inside the chamber 1 is controlled by a pressure gage 7 and a pressure switch 8, and switching of pressure is performed by shutoff valves 23, 24 in exhaust pipe 25 and gas inlet pipe 26, respectively.

Figure 2B:
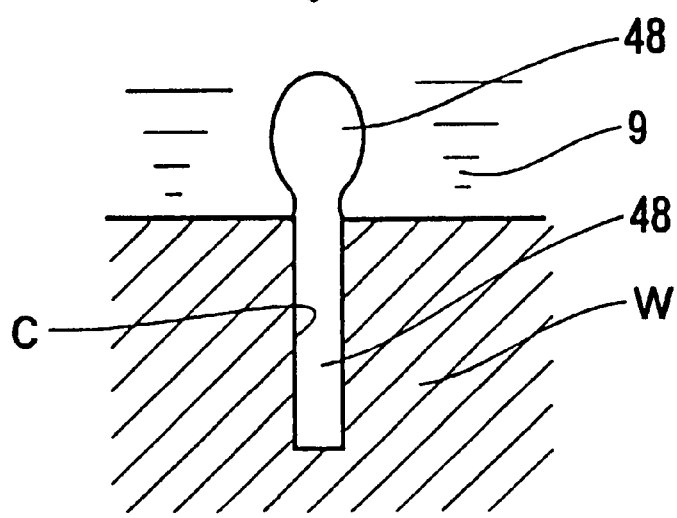
Figure 2C:
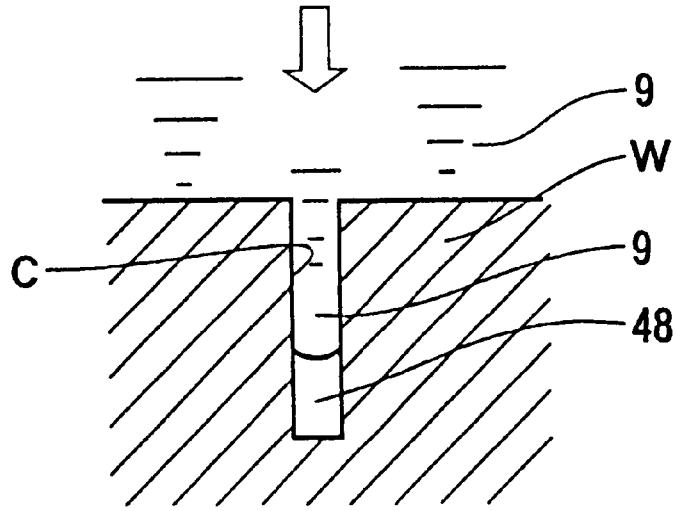

The process of plating a substrate W having microcavities (shortened to cavities hereinafter) using the plating apparatus will be explained. The substrate W is disposed inside the chamber 1 and immersed in the plating solution 9, then the vacuum pump 21 is operated to exhaust air from inside the chamber 1 through the exhaust pipe 25. Residual air 48 in the cavity C shown in FIG. 2A increases its volume due to pressure reduction in the surrounding, and as shown in FIG. 2B, a part is removed from the cavity C. After this step, the pressure is returned to atmospheric pressure, and the residual air inside the cavity C reduces its volume, and as shown in FIG. 2C, the plating solution 9 flows into a portion of the cavity C.

Chamber 1 is again reduced in pressure, and the solubility of air in the plating solution 9 is reduced, and fine-air-bubbles are formed in the solution 9. Also, with reduction in the interior chamber pressure, the volume of air bubbles adhering to the solid surface of components immersed in the plating solution 9 is also increased, and with a proportional increase in the buoyancy, the bubbles are floated off of the solid surfaces and removed from the plating solution 9.

Figure 3:
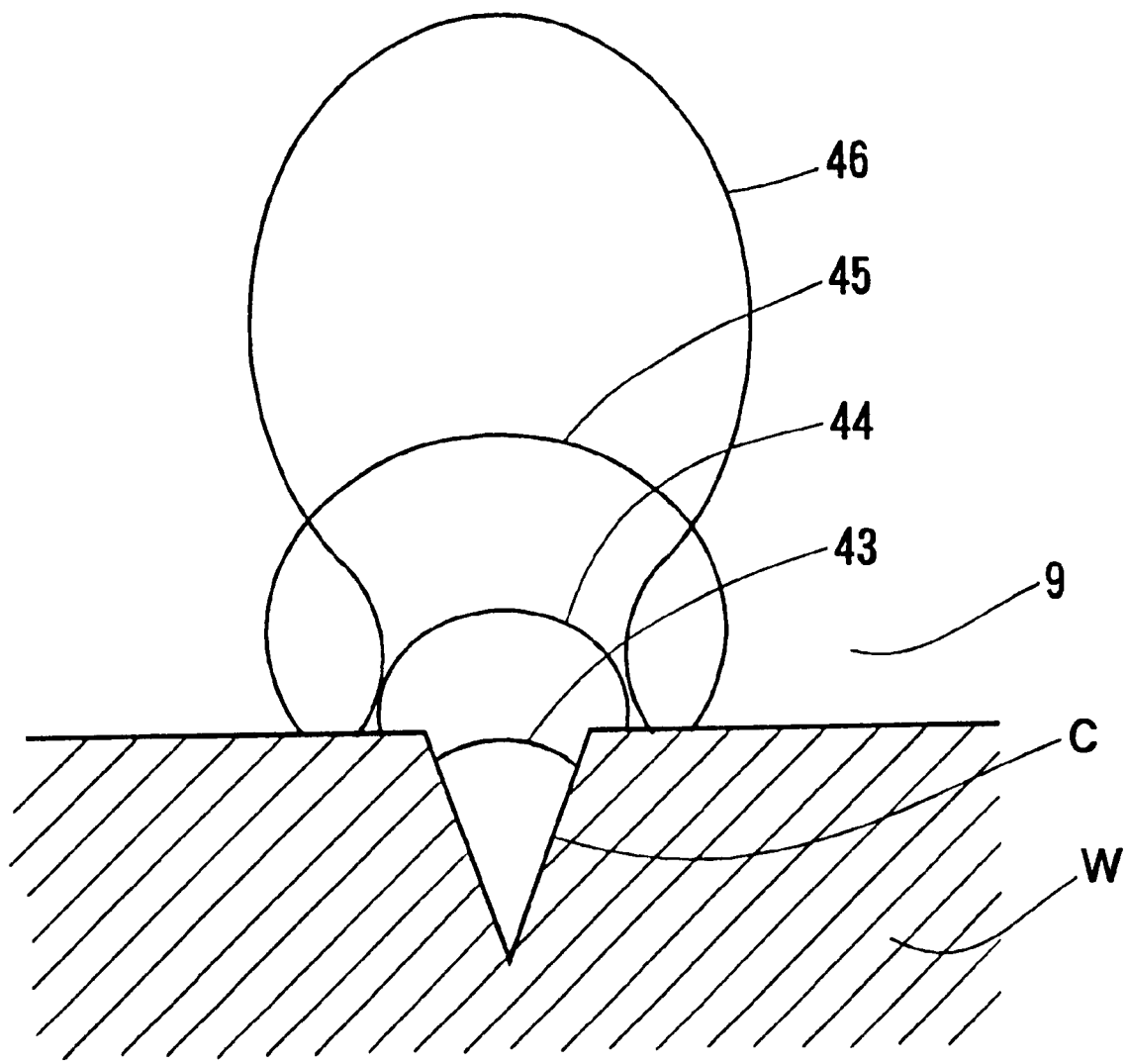
FIG. 3 is a conceptual illustration of a growth process of a bubble due to nucleate boiling.
Figure 4A:
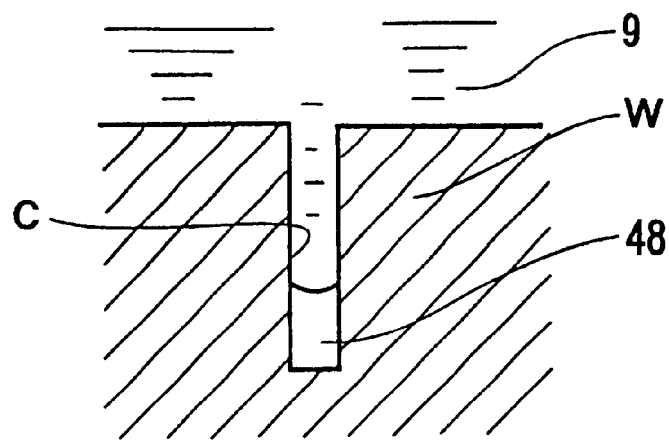
FIG. 4 is a conceptual illustration of an air-removal mechanism by reduced pressure boiling.
Figure 4B:
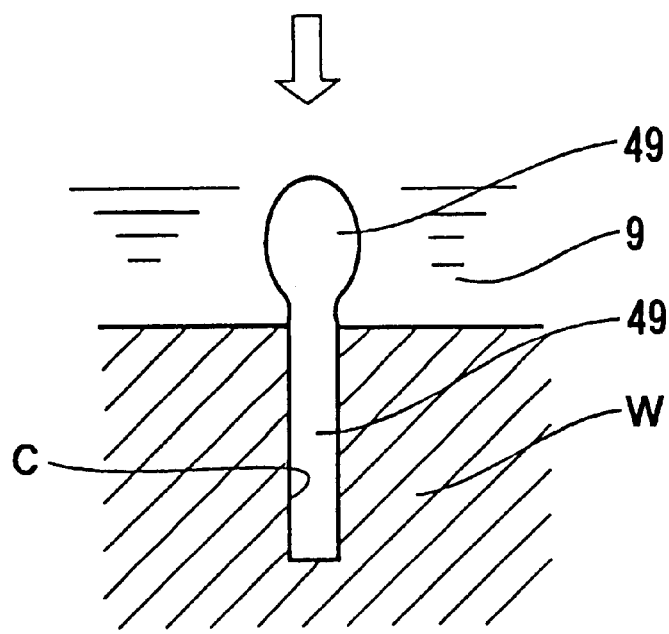
Figure 4C:
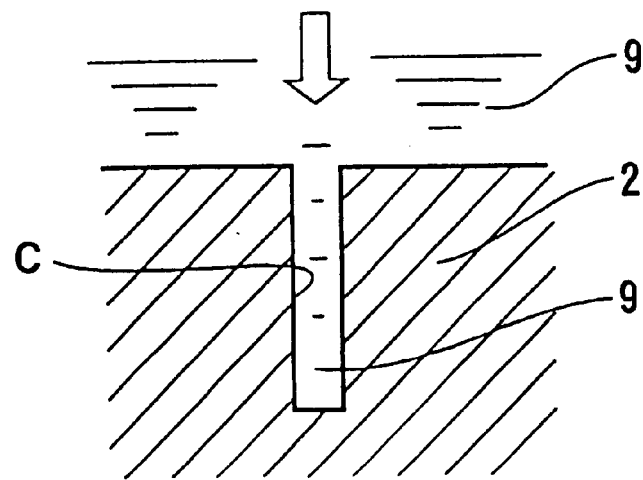

Next, the pressure in the chamber 1 in the condition shown in FIG. 4A is again reduced to a pressure less than the saturated vapor pressure of the plating solution 9, the liquid begins to boil or vaporize from the surface as well as from its interior, as illustrated in FIGS. 4A to 4B. In general, bubbles remaining inside the cavity C, as shown in FIG. 3, act as nuclei for boiling, and generate a process of repeated bubble growth and bubble rising. The cavities C formed on the substrate W can act as boiling nuclei, and the bubbles 44, 45, 46 generated by nucleate boiling mix with residual air in the cavity C to form a large bubble 49 which is removed from the cavity C. After this step, when the interior pressure is returned to atmospheric pressure, plating solution 9 infiltrates into the cavity C as shown in FIG. 4C. In this condition, power is turned on to the electrodes to carry out plating.

Figure 5:
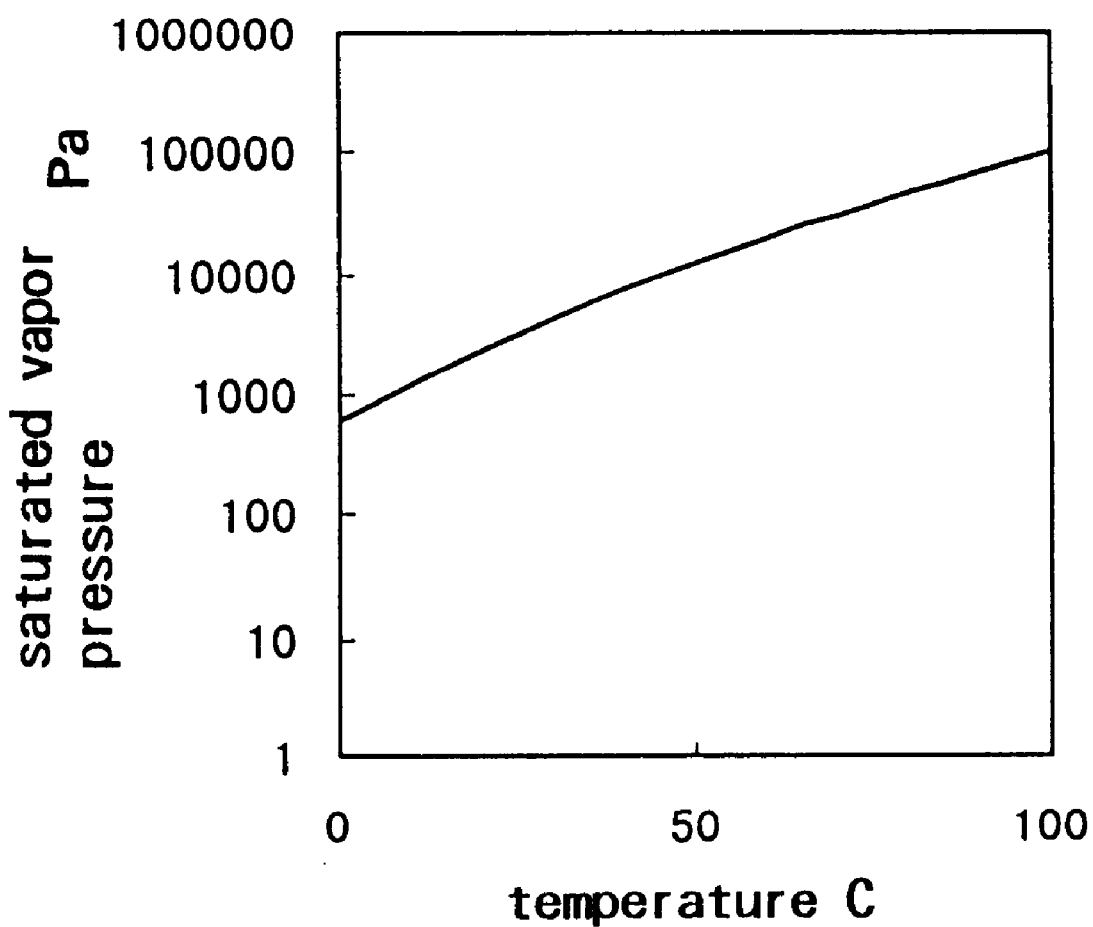
FIG. 5 is a water vapor pressure curve of saturated vapor.
Figure 6A:
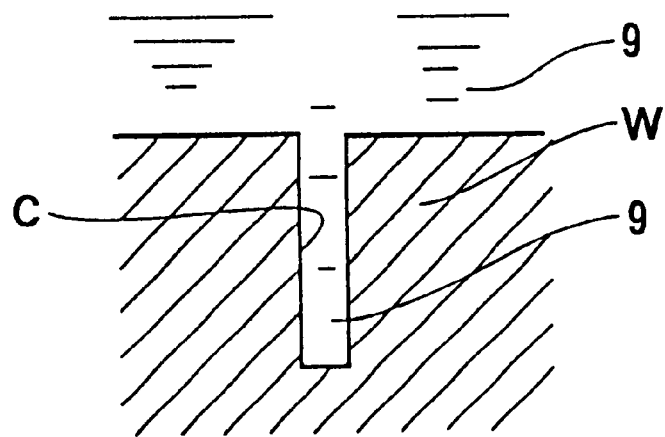
FIG. 6 is a conceptual illustration of plating solution replacement mechanism in the cavities by pressure reduction.
Figure 6B:
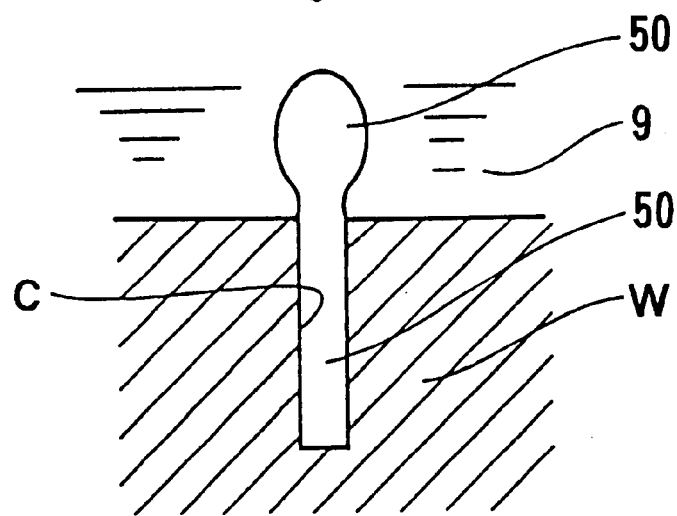
Figure 6C:
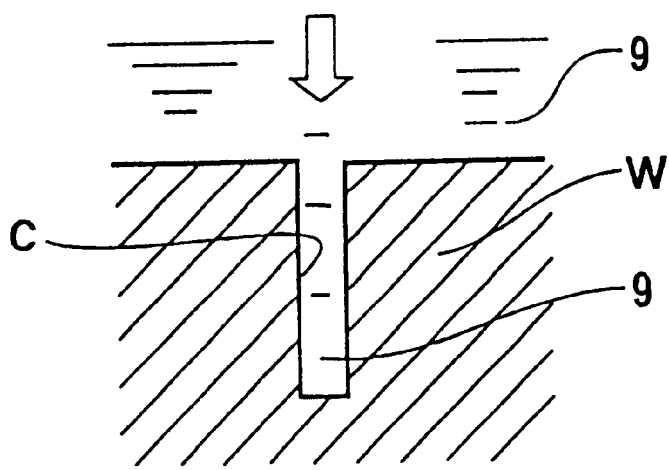

It should be noted that, as shown in FIG. 5, the boiling point of water is dependent on the pressure. Also, the boiling point of plating solution 9 is higher than that of water because of solutes in the plating solution. To boil such a liquid, it is necessary to heat the water to a temperature higher than 100° C., but by reducing the interior pressure of the chamber 1, the liquid can be boiled at a lower temperature. For example, if the pressure is reduced to about 2700 to 27,000 Pa (20 to 200 Torr), the temperature of the substrate W may need to be only 30~70° C. so that heating energy can be reduced and processing time shortened.

In the above process, pre-plating treatment is infiltration of the plating solution 9 into the cavities C, but it is also possible to replace the plating solution 9 in the cavity C during the plating process by reducing the interior pressure to less than the saturated vapor pressure of the plating solution 9. When the interior pressure is reduced during the plating process, solution boiling is induced by the cavity C acting as boiling nuclei to thereby stir up the surrounding plating solution 9. After this, the interior pressure is returned to atmospheric pressure, or pressurized once before returning to atmospheric pressure, and then fresh plating solution 9 flows into the cavity C. It is preferable to carry out this boiling step and pressurizing step repeatedly during the plating process.

FIG. 7 shows a second embodiment of the plating apparatus. In this case, the substrate W is attached to the bottom surface of a support jig 13 disposed in the upper section of the plating chamber 1. Plating solution 9 is stirred and circulated within the chamber 1 by the stirrer 11. The liquid heater 10 immersed in the plating solution 9 heats the solution, and the temperature sensor 6 monitors the solution temperature and adjusts the heater power through a controller (not shown) to maintain the plating solution 9 at a constant specific temperature.

Plating chamber 1 is connected through a set of parallel pipes auxiliary-exhaust pipe 29 and main exhaust pipe 30 to a vacuum pump 21. The main exhaust pipe 30 is provided with a shutoff valve 32 and the auxiliary-exhaust pipe 29 is provided with a shutoff valve 31 and a variable resistance valve 33. This arrangement allows a quick pressure reduction from atmospheric pressure by pumping with all the valves 31~33 open, and after reaching a certain degree of vacuum, the shutoff valve on the main exhaust pipe is closed, and the interior pressure is adjusted within a narrow range by operating the variable resistance valve 33. Therefore, the interior pressure of the plating chamber 1 can be switched to a vacuum of less than the saturated vapor pressure or an intermediate pressure between the saturated vapor pressure and the atmospheric pressure. The operation of this embodiment apparatus is the same as the first embodiment apparatus, and explanation will be omitted.

Figure 8:
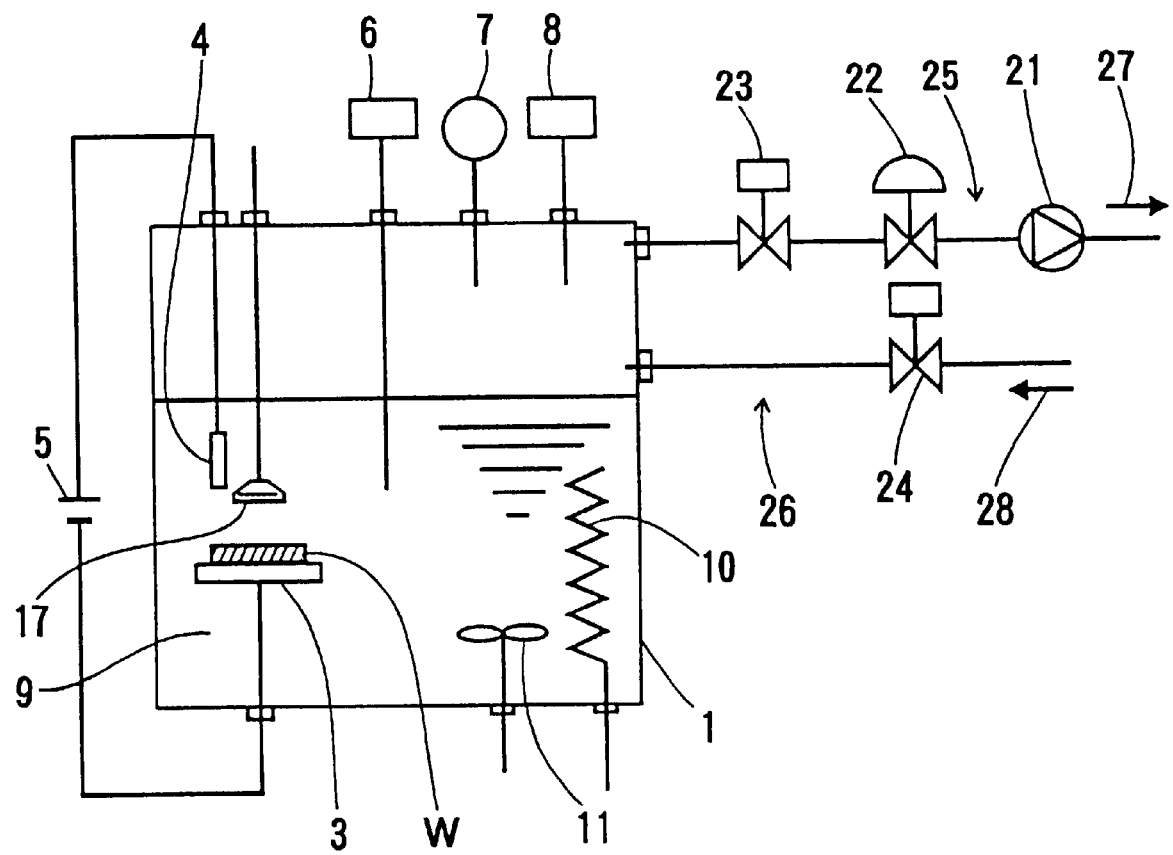
FIG. 8 is a third embodiment of the plating apparatus of the present invention.

FIG. 8 is a schematic illustration of a third plating apparatus. The differences between this embodiment apparatus and the first apparatus are that there are an ultrasonic vibrator device 17 disposed to oppose the substrate holding stage in the chamber 1 and a stirrer 11 in a certain location of the chamber 1. This apparatus is also able to remove residual air bubbles from the cavities C through the steps described in the previous embodiment, but this apparatus is able to operate the ultrasonic vibrator device 17 at a certain amplitude and frequency in each step as needed to facilitate removal of bubbles from the cavities C and/or nucleate boiling.

Figure 9:
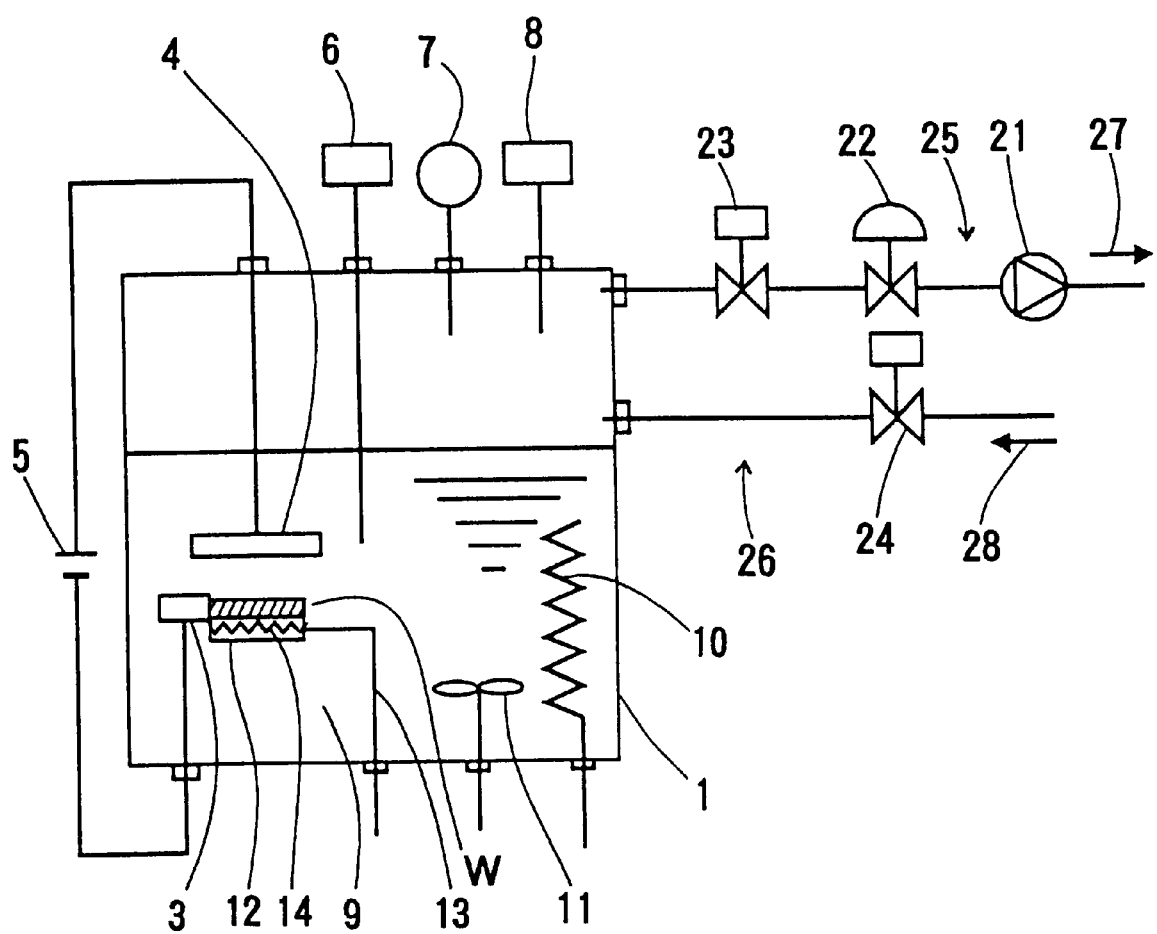
FIG. 9 is a fourth embodiment of the plating apparatus of the present invention.
Figure 10:
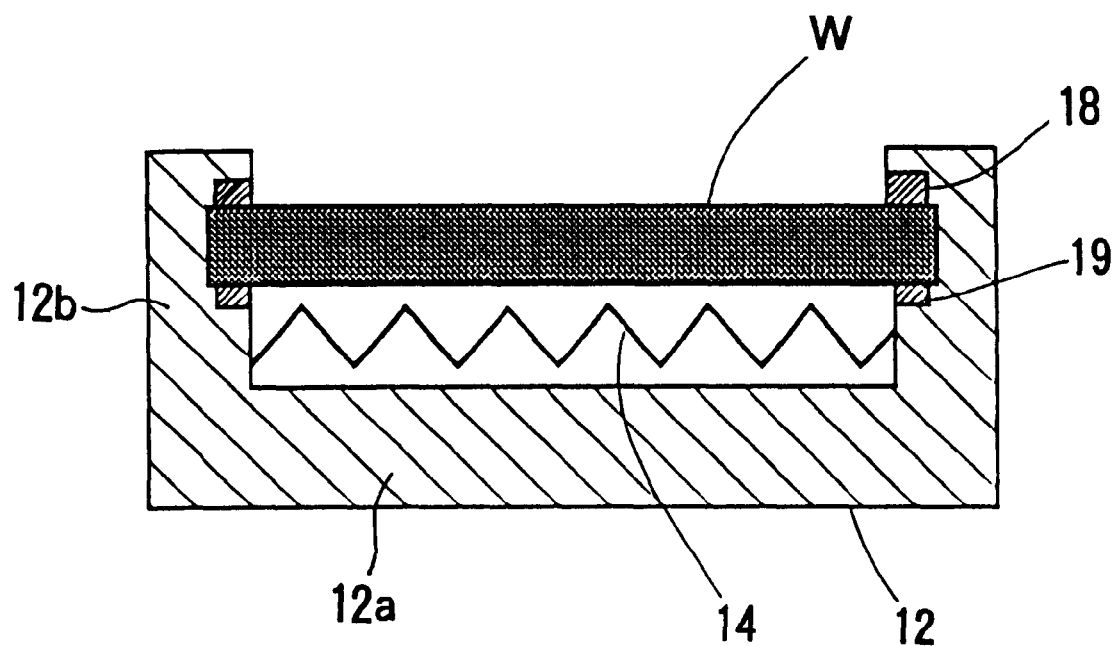
FIG. 10 is a cross sectional view of a substrate heating device shown in FIG. 9.

FIG. 9 shows a fourth embodiment of the plating apparatus of the present invention. This apparatus is provided with a heating section for heating the back surface of the substrate W as shown in FIG. 10. Specifically, the substrate W is supported on a substrate holding stage 12 comprised by a circular bottom plate 12a of a diameter larger than the substrate W and a lateral wall section 12b surrounding the bottom plate 12a. A sealed liquid space is formed below the substrate W by seals 18, 19, and a heater 14 for heating the substrate W is provided in the space. The substrate heater 14 is encased in a heat-resistant electrical insulating rubber, and is connected to an external power source (not shown) through the substrate stage 12. The substrate heater 14 is thus able to provide heat to the substrate W without coming into contact with the plating solution 9. It is also possible to assign the substrate stage 12 to act as the cathode 3.

The operation of the apparatus having the above structure will be explained next. The substrate W is disposed inside the chamber 1 and is immersed in the plating solution 9, then the interior space is evacuated through the exhaust pipe 25 by operating the vacuum pump 21. Residual air 48 in the cavity C shown in FIG. 2A increases its volume because of reduced pressure, and as shown in FIG. 2B, a portion of the air is removed from the cavity C. After this step, when the interior pressure is returned to atmospheric pressure, the volume of residual air is compressed and, as shown in FIG. 2C, plating solution 9 enters into the cavity C.

In this condition, the substrate W is heated from the back by the substrate heater 14, which heats the inside space of the cavity C from the underside. In this case, solubility of air that can be dissolved in plating solution 9 inside the cavity C is lowered, and the volume of residual air 48 is expanded. When the temperature of the plating solution inside the cavity C reaches a certain value, the volume of the bubbles adhering to the solid surfaces in the plating solution 9 is also increased, and the buoyancy, increased in proportion to the volume increase, assists the bubbles to depart from the solid surfaces and be removed from the plating solution 9.

When the temperature of plating solution 9 exceeds the boiling point of the plating solution 9 under the existing interior pressure, air 48 in the state shown in FIG. 4A begins to boil or vaporize from the surface as well as from the interior of the liquid 9, as illustrated in FIG. 4B. In this case, bubbles 43 remaining inside the cavity C, as shown in FIG. 3, act as nuclei for boiling, and generate a process of repeated growth and rising illustrated by bubbles 44, 45, 46. Bubbles 44, 45, 46 generated by nucleate boiling mix with residual air in the cavity C to form a large bubble 49, which is removed from the cavity C. After this step, when the interior pressure is returned to atmospheric pressure, plating solution 9 infiltrates the cavity C as shown in FIG. 4C. In this condition, power is turned on to the electrodes to carry out plating.

In the above process, pre-plating treatment is infiltration of the plating solution 9 into the cavities C, but it is also possible to replace the plating solution 9 in the cavity C during the plating process, by heating the substrate W during the plating process. When the substrate W is heated during the plating process so that the temperature of the plating solution 9 locally becomes higher than the boiling point at that pressure, nucleate boiling is generated in the cavity C acting as boiling nuclei to stir up the surrounding plating solution 9. After this, the interior pressure and is returned to atmospheric pressure, then fresh plating solution 9 flows into the cavity C.

FIG. 11 shows a schematic diagram of the plating apparatus in a fifth embodiment. In this apparatus, the substrate W is attached vertically to the bottom surface of a support jig 13 disposed in the upper section of the chamber 1. Opposite to the substrate W, a fan 16 directs the plating solution 9 towards the surface of substrate W. Similar to the apparatus shown in FIG. 7, plating chamber 1 is provided with auxiliary-exhaust pipe 29 and main exhaust pipe 30 so as to enable quick switching of the interior pressure between a reduced pressure below the saturated vapor pressure of the plating solution 9 and a reduced pressure intermediate between the saturated vapor pressure and atmospheric pressure. Basic operation of the apparatus is the same as that in previous apparatus, and the explanations are omitted.

Also, as shown in FIG. 12 for the sixth embodiment, other than heating to boil the liquid in the space of the cavity C, liquid entry into the cavity C or liquid replacement in the cavity C can be enhanced by using the ultrasonic vibration device 17 or by vibrating the substrate W itself.

The following embodiments relate to pre-plating treatment apparatuses to provide a pre-plating treatment to substrate W by using the apparatus shown in FIG. 28, for example. The apparatus shown in FIG. 13 is comprised by an air-tightly closable vessel type processing chamber 53, a vacuum pipe 54, liquid inlet pipe 55, gas inlet pipe 56 and gas exhaust pipe 57 each connected to the chamber 53. Processing chamber 53 is provided with a pressure gage 7, a pressure switch 8 and a safety valve 36, and a substrate stage 12 for placing the substrate W.

Vacuum pipe 54 is provided with a shutoff valve 23 and a vacuum pump 21, and is capable of reducing the interior pressure of the chamber 53 to a suitable low pressure. A liquid supply source (not shown) is connected, through the liquid inlet pipe 55 having a shutoff valve 34 and a flowmeter 40, to a nozzle 55a facing the substrate stage 12 in the processing chamber 53 to introduce a desired volume of liquid in the processing chamber 53. Gas inlet pipe 56 has a regulator 51 and a shutoff valve 24, and gas exhaust pipe 57 is open to atmosphere by way of a shutoff valve 31. Further, a liquid discharge pipe 58 with a shutoff valve 35 is provided at the bottommost section of the processing chamber 53. Gas inlet pipe 56 and liquid discharge pipe 58 are operated together to facilitate discharge and blow of the liquid.

Figure 14A:
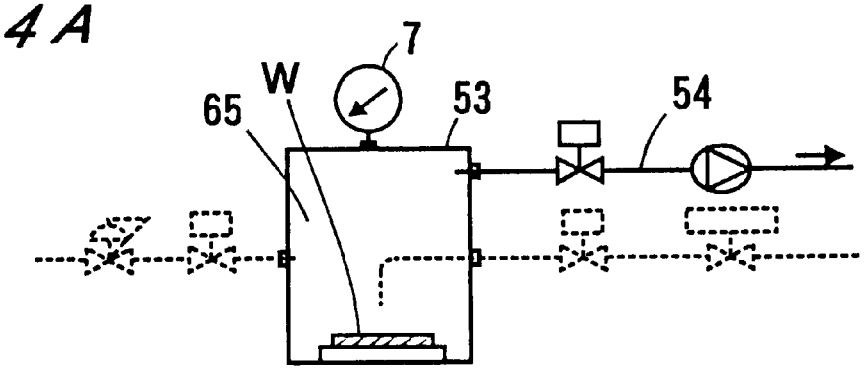
FIG. 14 is a schematic illustration of a liquid infiltration process into micro-cavities.
Figure 29:
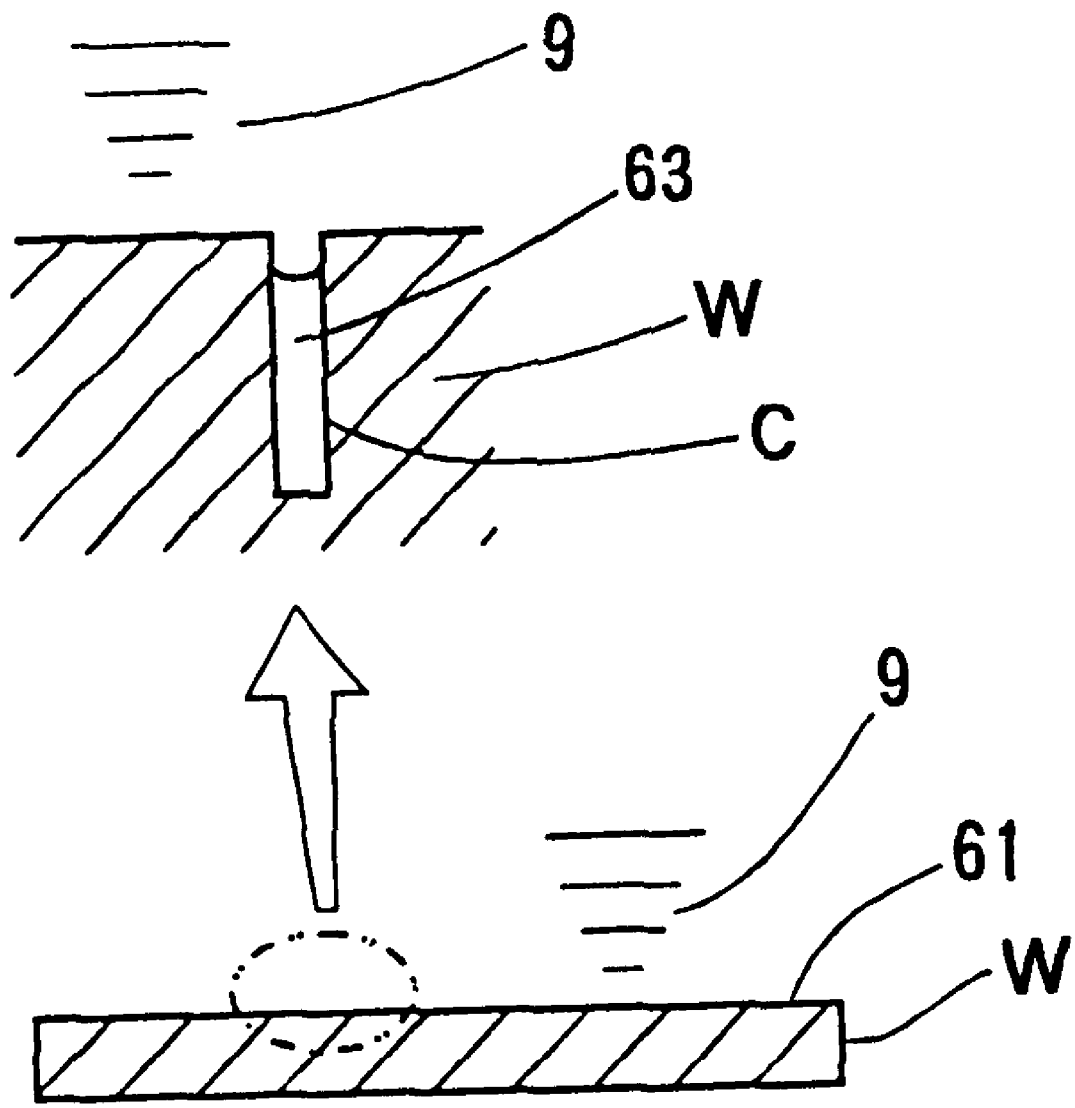
FIG. 29 is an illustration of air bubbles remaining in cavities.

The process of pre-plating treatment using the apparatus will be explained next. The substrate W is provided with micro cavities C on the surface, similar to those shown in FIG. 29, of a size of 0.2 $\mu$m width and 0.8 $\mu$m depth, for example. As shown in FIG. 14A, the substrate W is placed on the substrate support and the sealed chamber 53 is evacuated by opening the shutoff valve 23 and operating the vacuum pump 21 to exhaust non-condensable gases, such as air, through the vacuum pipe 54 to attain a reduced pressure of about 0.01 Torr.

Figure 14B:
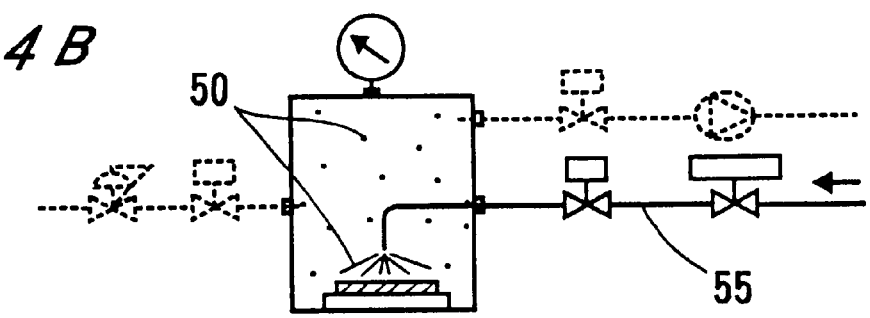
Figure 14C:
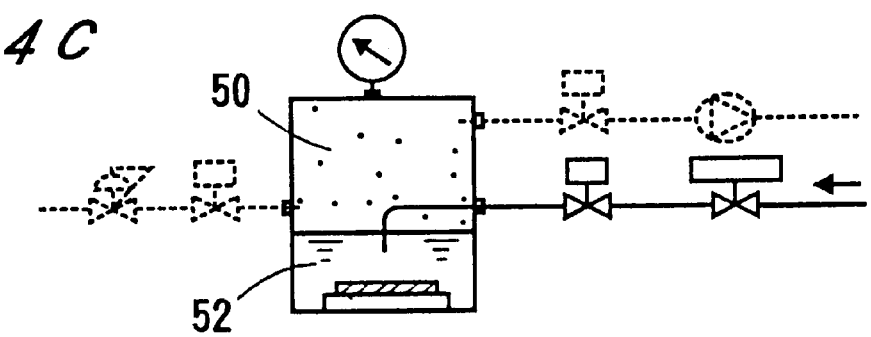

Next, as shown in FIG. 14B, a suitable liquid medium such as plating solution, high purity water or alcohol is introduced into the chamber 53, through the liquid inlet pipe 55 and the nozzle 55a, at normal pressure and temperature. The liquid at first exists as a vapor 50 in the space of the sealed chamber 53. When more liquid is supplied so that the pressure inside the chamber 53 reached the saturated vapor pressure, the liquid begins to collect as liquid in the chamber 53, and when the substrate W is immersed in the liquid, its surface comes into contact with the liquid.

Figure 14D:
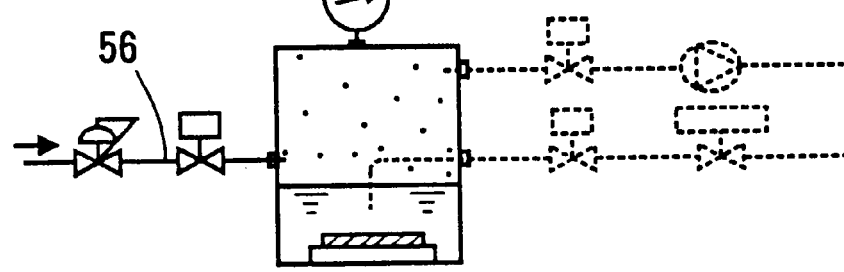

In this state, bubbles remain on the inside surfaces of the cavity C on the substrate W, because of surface tension and other effects. Therefore, as shown in FIG. 14D, by opening the shutoff valve 24 of the gas inlet pipe 56, a gas 28 is introduced into the sealed chamber 53 to pressurize the liquid, or a vibration device is operated to thereby collapse the bubbles and let the liquid infiltrate the cavity C. In the example shown in FIG. 13, vibration is generated by repeating opening and closing of the shutoff valve 31 of gas inlet pipe 57 in short cycles by a driver device (not-shown) while applying gas pressure from the gas inlet pipe 56.

To facilitate infiltration of a liquid into the cavity C, the liquid in this case may preferably be a substance of small surface tension with respect to the substrate W, or some surface active agent may be added to the liquid.

After providing such a pre-plating treatment, the substrate W is removed from the processing chamber 53 so as not to dry the substrate W before it is transferred to the plating chamber 1 (refer to FIG. 28), and is then immersed in the plating solution 9 to perform electroplating or electroless plating. Because of the pre-plating treatment, the cavity C is already infiltrated with the liquid, and the plating solution 9 can merge into the liquid inside the cavity C to promote plating on the inside surfaces.

In the apparatus shown in FIG. 13, substrates W are processed one at a time, but a plurality of substrates W may be processed simultaneously. This is accomplished by using a cassette to contain a plurality of substrates W so as to permit handling of a plurality of processed substrates or substrates to be processed at a time to thereby improve the productivity. If the cassette can hold liquid, substrates W can be prevented from drying by retaining them in the immersed state. Processing chamber 53 and the plating apparatus may be made as one chamber so that pre-plating and plating processes can be carried out continually.

Figure 15:
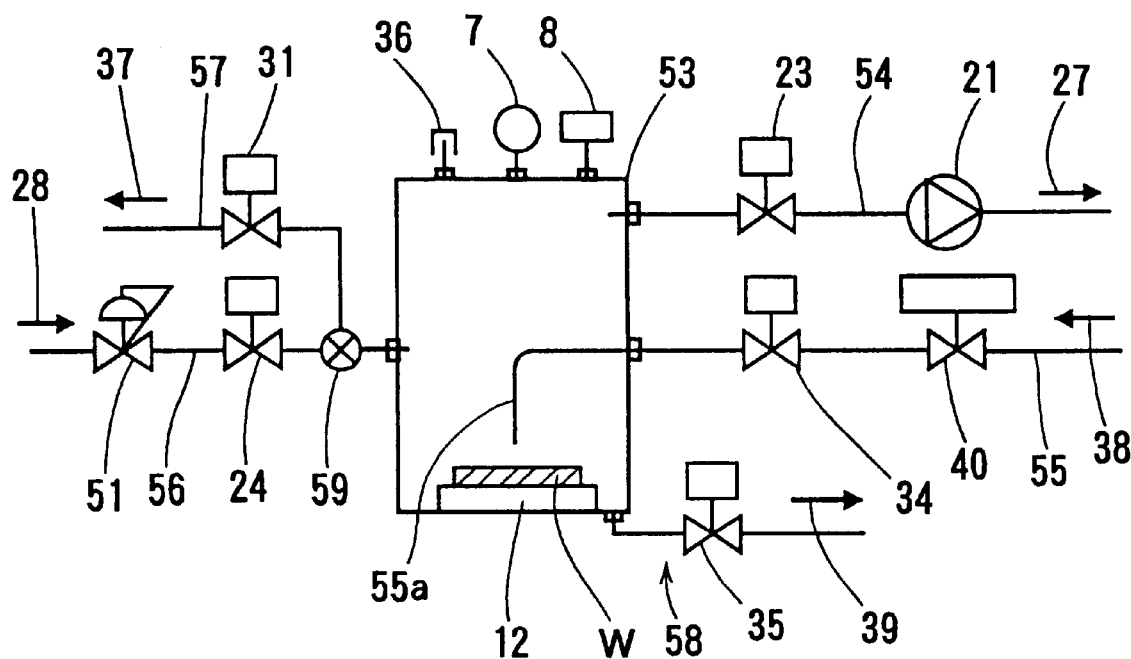
FIG. 15 is a schematic illustration of another embodiment of the pre-plating treatment apparatus.

FIG. 15 shows another embodiment of the pre-plating treatment apparatus. This apparatus is similar to the one shown in FIG. 13, but differs in the aspect of the method of applying vibration. In this case, gas inlet pipe 56 and gas discharge pipe 57 are branched through a rotary valve 59. By the rotational action of the rotary valve 59, the processing chamber 53 is alternately connected to either the gas inlet pipe 56 or the gas discharge pipe 57 thereby to generate a large pressure variation.

FIG. 16 shows still another embodiment of the pre-plating treatment apparatus. This apparatus is roughly similar to the previous apparatus, but differs in the method of varying the pressure. In this case, an ultrasonic vibrator 60 is disposed in the processing chamber 53 so that, after the ultrasonic vibrator 60 and the substrate W are immersed in the liquid 52, the vibrator 60 is activated to apply vibration by ay of plating solution 9 to the substrate W.

Figure 17:
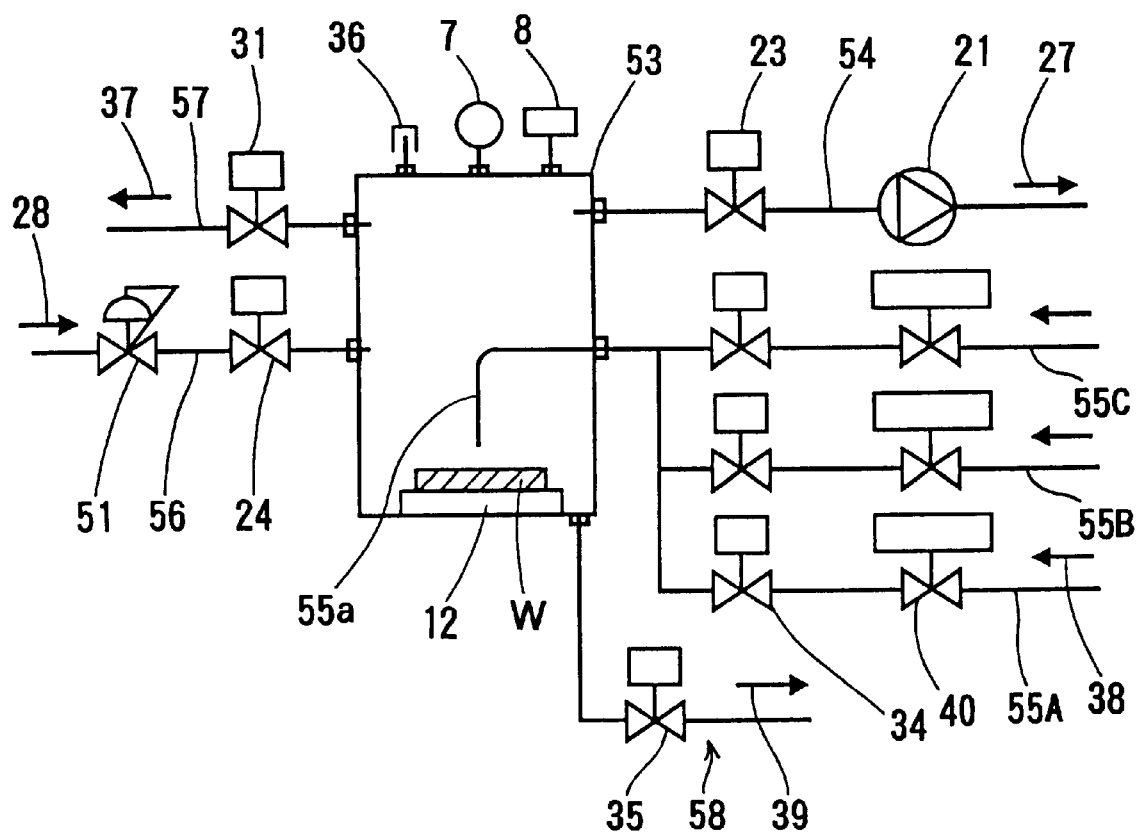
FIG. 17 is a schematic illustration of another embodiment of the pre-plating treatment apparatus.

FIG. 17 shows still another embodiment of the pre-plating treatment apparatus. This apparatus is roughly similar to the previous apparatus also, but differs in the aspect of the liquid admitting system having a plurality of liquid inlet pipes 55A, 55B, 55C. Thus, it is possible to supply a plurality of liquids to the processing chamber 53 sequentially or at the same time. Therefore, depending on the type of substrate and treatment conditions, substances having different properties, such as different boiling points or additive agents such as a surface activator can be supplied to the chamber 53 at a given quantity or in a given sequence.

Figure 18:
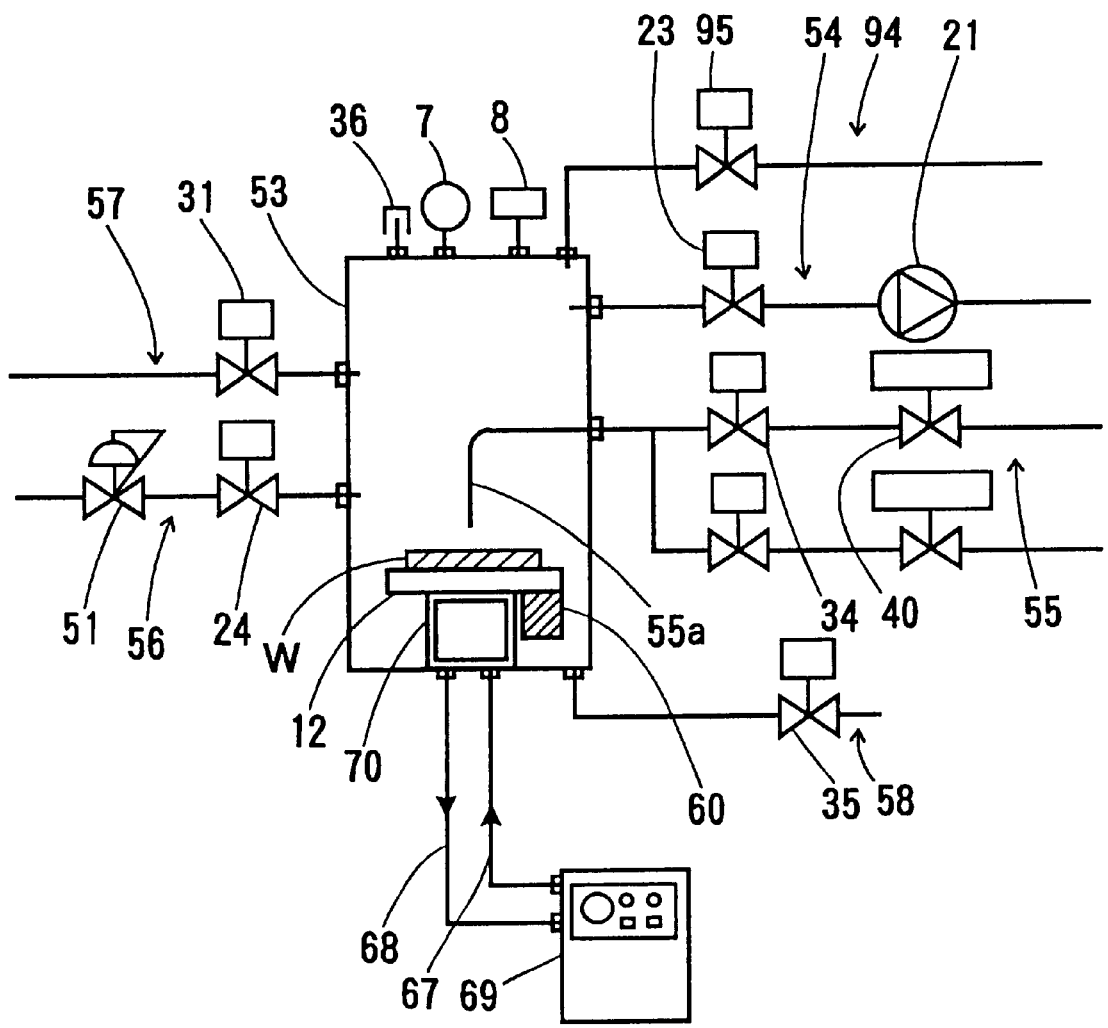
FIG. 18 is a schematic illustration of another embodiment of the pre-plating treatment apparatus.

FIG. 18 is a still another embodiment of the pre-plating treatment apparatus. This apparatus is comprised primarily by an air-tightly closable vessel-like processing chamber 53 and a vacuum pipe 54, a condensable gas inlet pipe 94, a liquid inlet pipe 56, a gas discharge pipe 57, and a liquid discharge pipe 58 each connected to the chamber 53. A pressure gage 7, a pressure switch 8, and a safety valve 36 are attached to the processing chamber 53. A substrate stage 12 for placing the substrate W is disposed inside the chamber 53, and the substrate stage 12 is provided with an ultrasonic vibrator 60. A cooling medium header 70, provided on the back side of the substrate stage 12, is connected to a cooling medium chiller device 69 via cooling medium delivery pipes 67, 68. The cooling medium header 70 is filled with a cooling medium supplied from the medium chiller device 69, and controls the temperature of the substrate W through the substrate stage 12.

Vacuum pipe 54 is connected to a vacuum pump through a shutoff valve 23 to reduce the chamber pressure to a desired low pressure. Condensable gas inlet pipe 94 admits a gas condensable at a certain pressure and a temperature into the chamber 53 through a shutoff valve 95. Liquid inlet valve 55 is connected to a nozzle 55a facing the substrate stage 12 inside the chamber 53 through a shutoff valve 34 and a flowmeter 40 for introducing a certain desired quantity of liquid inside the chamber 53. The liquid inlet pipe has two branches for admitting two types of liquid sequentially or at the same time. Gas inlet pipe 56 is connected to a gas source through a regulator 51 and a shutoff valve 24, and gas discharge pipe 57 is connected externally through a shutoff valve 31. Liquid discharge pipe 58 is connected to a storage tank (not shown) through a shutoff valve 35.

A method of using the apparatus of the construction presented above, to provide a pre-plating process, will be explained next. First, the substrate W is placed on the substrate stage 12, and the pressure inside the chamber 53 is reduced to an appropriately low level required by the processing parameters. Ethyl alcohol is then introduced into the chamber 53 through the gas inlet pipe 94, so that the interior pressure will be 5500 Pa (41 Torr). When the interior temperature is 20° C., this alcohol is in a vapor state inside the chamber 53. Therefore, alcohol vapor fills the chamber space including the cavities C formed on the substrate W.

Next, cooling medium at 5° C. is supplied to the cooling medium header 70 from the chiller 69 to cool the substrate W through the substrate stage 12. As the substrate W is cooled, ethyl alcohol inside the cavity C is cooled and condensation of alcohol takes place. When the vapor is cooled gradually as in this case, the vapor can be in a supercooled state so that often the vapor does not condense (liquefy) even when the temperature reaches below the condensing temperature. Therefore, in this embodiment, the substrate W is vibrated with the ultrasonic vibrator 60 to force the alcohol vapor in the cavities C to be released from the super-cooled state to commence condensation. Ethyl alcohol vapor inside the cavity C begins to condense as the result of application of cooling and ultrasonic vibration, and attaches to the inside surface of the cavity C in the form of droplets or film. Thus, ethyl alcohol liquid is infiltrated inside the cavity C.

After applying this pre-plating treatment, plating solution and other liquid are introduced through the liquid inlet pipe 55 to immerse the substrate W, then, these liquids flow into the cavity C by the effect of surface tension forces between the liquid ethyl alcohol already existing inside the cavities C and the new liquids. To assure complete infiltration of those liquids into the cavities C, substrate W may be vibrated with the ultrasonic vibrator 60 or the pressure may be varied using the gas inlet pipe 56 and gas discharge pipe 57.

It should be noted that the condensable gas should have small surface tension with respect to the material of substrate W and high affinity with the plating solution to assure complete liquid infiltration into the cavities C. Condensable gases of such nature includes water, propyl alcohol, acetone and ammonia.

After providing such a pre-plating treatment, the substrate W is taken out of the chamber 53, and is transferred while still wet to plating chamber 1 shown in FIG. 28 to immerse in the plating solution to carry out plating. Because of the pre-plating treatment, the cavities C are filled reliably with the plating solution to produce a metal deposit of high quality inside the cavities C.

In the apparatus shown in FIG. 18, substrates W are handled one at a time, but a plurality of substrates W may be treated by having a cassette to hold many substrates. Supply and transfer of substrates can be facilitated by using such a cassette, and by filling the cassette with a liquid, drying of the substrates W can be prevented.

Figure 19:
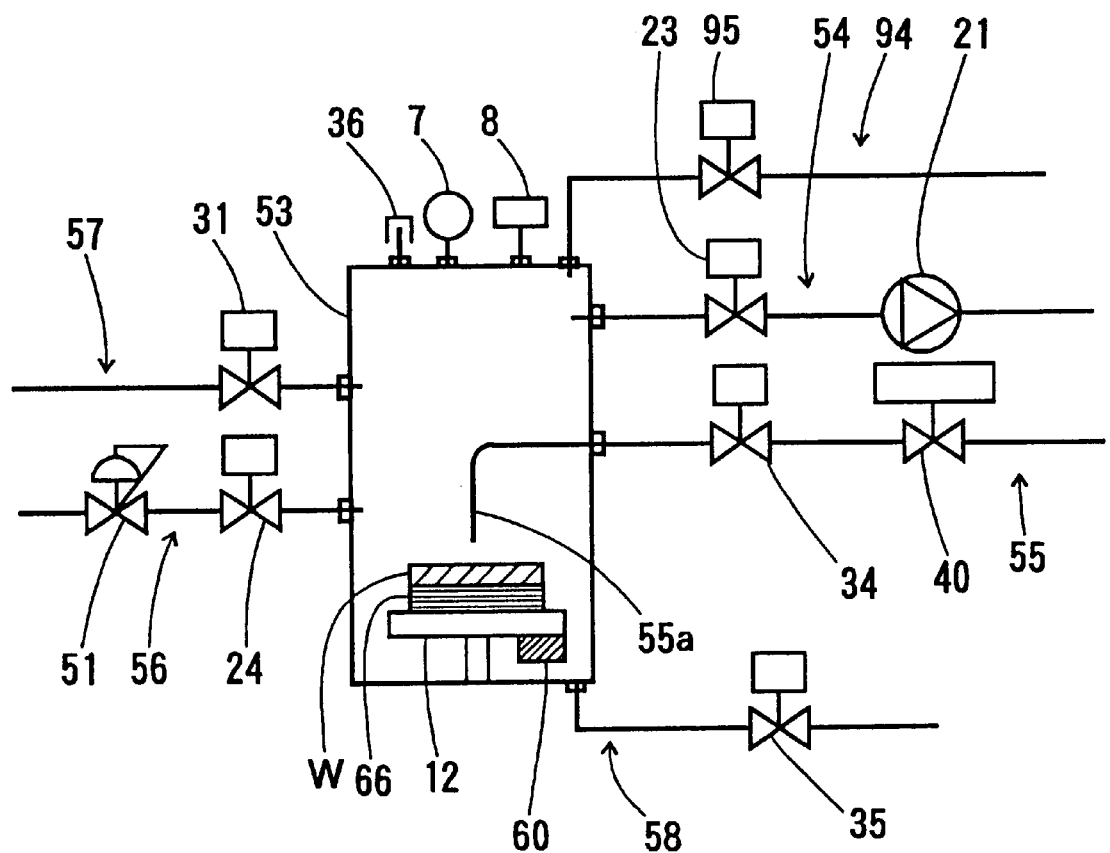
FIG. 19 is a schematic illustration of another embodiment of the pre-plating treatment apparatus.

FIG. 19 shows another pre-plating treatment apparatus. This apparatus is similar to the one shown in FIG. 18 but differs in one respect of using a Peltier cooling element 66 for cooling the substrate W. The advantage is that coolant chiller device 69 and cooling medium delivery pipes 67, 68 are not required.

Figure 20:
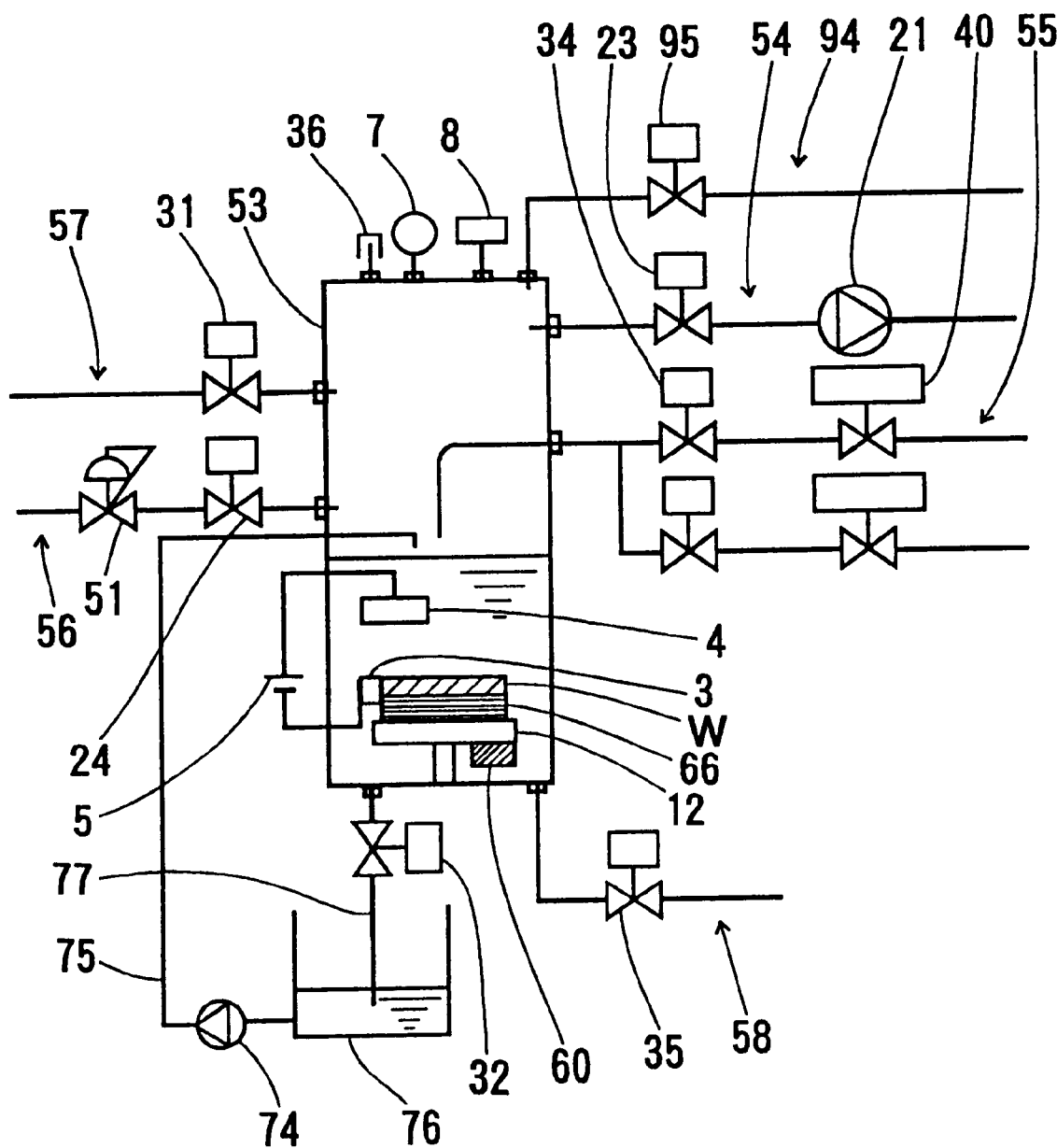
FIG. 20 is a schematic illustration of another embodiment of the pre-plating treatment apparatus.

FIG. 20 shows an apparatus which combines the pre-plating apparatus using the Peltier cooling element 66 with the plating apparatus shown in FIG. 28. In addition to the pre-plating apparatus shown in FIG. 19, this apparatus is provided with a pump 74 for supplying a plating solution to the chamber 53 through a supply pipe 75, and a drain pipe 77 to drain off spent solution into a storage tank 76 through a valve 32 disposed at the bottom section of the chamber 53. The combined apparatus is also provided with an anode 4 and a cathode 3 and an electrical power source 5.

In using this apparatus, the plating solution is first drained through the drain pipe 77 to prepare the apparatus for pre-plating treatment in accordance with the method described above. When the cavities C are filled with some treatment liquid, the pre-plating treatment is stopped, and after breaking the vacuum as required, plating solution is supplied through the supply pipe 75 to perform plating. This combination apparatus is advantageous because there is no need to transfer the substrates such that plating process can be carried out following the pre-plating treatment without interruption, thereby saving a considerable number of operational steps.

FIG. 21 shows such an apparatus for providing continuous pre-plating and plating operations. The apparatus is comprised by a pre-treatment chamber 97, a load-and-lock chamber 96 to enable to load and unload the substrates W without breaking the atmosphere in the pre-treatment chamber 97, a plating chamber 98, and a substrate supply chamber 100 to supply the substrates W. Load-and-lock chamber 96 is connected to other chambers by way of a gate 100. The load-and-lock chamber 96 is connected to an exhaust path for evacuation, and is also provided with a substrate transport system such as a robotic hand. In this example, two plating chambers 98 are provided for one pre-treatment chamber 97, in view of the length of time required for pre-treatment process.

In the present apparatus, substrates are transferred between the load-and-lock chamber 96 and pre-treatment chamber 97, with the load-and-lock chamber 97 in an evacuated state by closing the gate 99 between the plating chamber 98 and the substrate supply chamber 100. This arrangement permits substrate W to be loaded and unloaded without breaking the vacuum in the pre-treatment chamber 97 so that processing in the pre-treatment chamber 97 can be carried out without loss of time. The load-and-lock chamber may be provided with more than five entrances and also, a cleaning chamber may be provided as needed.

Figure 22:
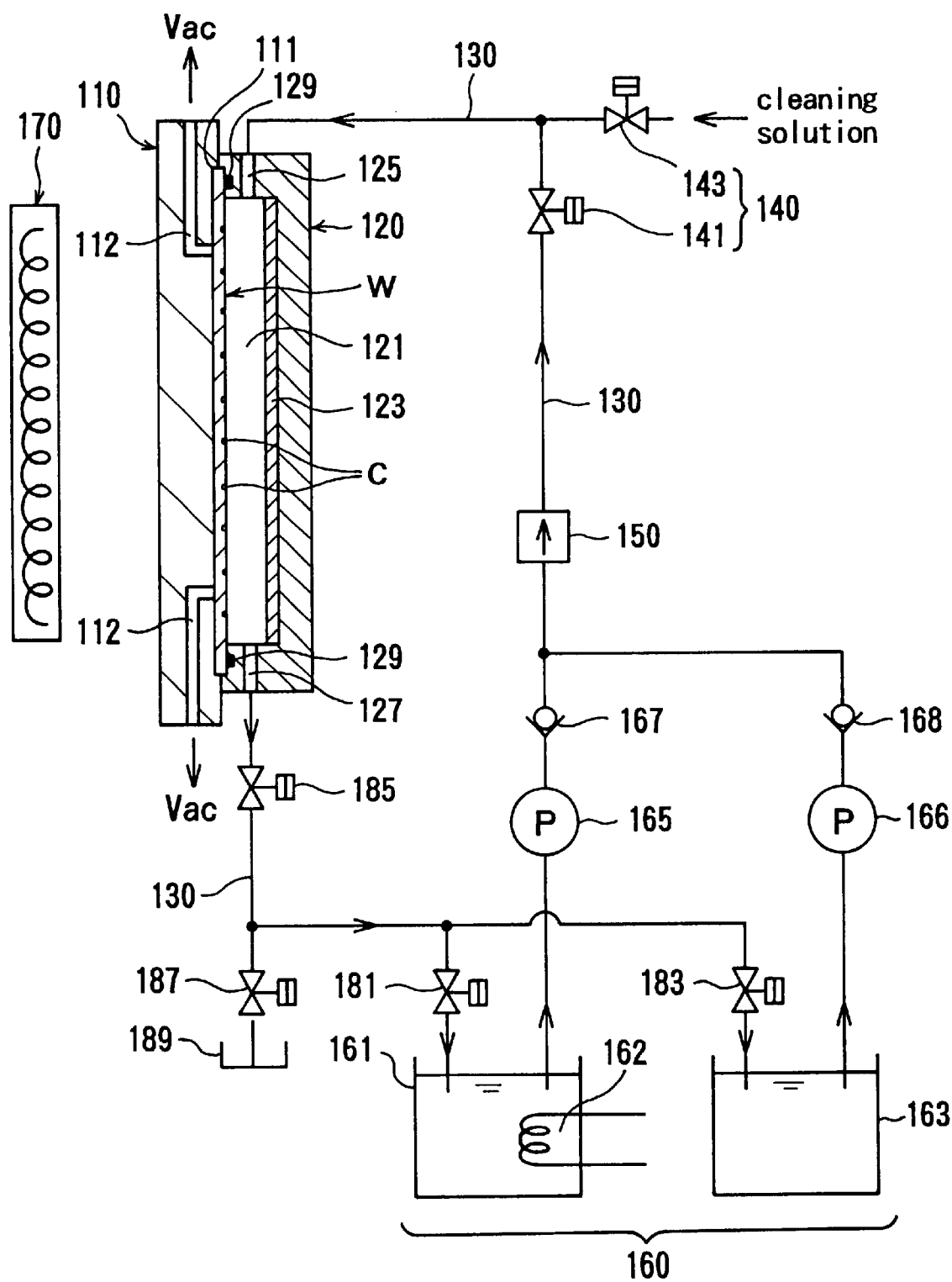
FIG. 22 is an overall schematic view of an embodiment of a plating apparatus for a semiconductor wafer.

In the following, another embodiment of the plating apparatus will be explained with reference to the drawings. FIG. 22 shows an overall schematic view of the apparatus for filling the cavities W with metal plating.

The apparatus is comprised by a substrate fixation plate 110 for fixing the substrate W in place by suction on one surface of the substrate W, a cap section 120 for covering the opposite surface of the substrate W, piping 130 attached to the cap section 120, a liquid switching device 140, a pressurization control valve 150, a liquid temperature switching device 160 provided within the piping 130, and a substrate heating device 170 disposed near the substrate fixation plate 110. The structure of these components will be explained below.

Substrate fixation plate 110 is a pressure resistant quartz plate to withstand pressures in excess of 10 kgf/cm$^2$, and has a shallow depression section 111 on one surface for receiving the substrate W at a fixed position, and holes 112 are provided to open within the depression section 111 for vacuum chucking of the substrate W.

Cap section 120 is also resistant to pressures in excess of 10 kgf/cm$^2$ and has a depressed part opposite to the substrate W to form a liquid holding space 121 so that it may be used for electroplating operation by placing an anode 123 on the bottom surface of the liquid holding space 121. For electroless plating, anode 123 is not required. Liquid supply piping 130 is connected to inlet and outlet ports 125, 127 formed in the cap section 120 to provide the liquid holding space 121 with liquids such as plating solution or cleaning solution. A packing 129 is provided around the periphery of the cap section 120 to seal the liquid holding space 121 by having the cap section 120 pressing down on the substrate W.

Liquid switching device 140 splits the pipe 130 into two branches provided with a respective switching valve 141 and 143. For example, by opening the valve 141 and closing the valve 143, the plating solution flows into the liquid holding space 121 through the valve 141, and when the valve 141 is closed but the valve 143 is opened, a cleaning solution such as pure water for cleaning out the plating solution is supplied into the liquid holding space 121 through the pipe 130. When the cleaning solution is being supplied to cap section 120, valve 187 is opened so that the spent cleaning solution can be drained to the drain trough 189.

Liquid temperature switching device 160 is provided with a low temperature chamber 63 and a high temperature chamber 161 for storing the plating solution, and each tank is connected to the cap section 120 at the discharge end through pipe 130 and respective valves 181, 183. The pipe 130 is introduced to each of the chamber 161, 163 by way of a respective pump 165, 166 and one-way valve 167, 168. The down stream side of the one way valves 167, 168 is merged into one pipe 130 and is connected to a pressurization control valve 150. High temperature chamber 161 uses a heater 162 to keep the plating solution at a temperature in a range of 25~40° C. for electroplating or in a range of 50~90° C. for electroless plating, for example. Low temperature chamber 163 is for keeping the plating solution at room temperature, for example. The pipe 130 on the discharge port side of the cap section 120 is provided with a valve 185.

Substrate heating device 170 may be a lamp heater, and is used to warm the substrate W from its back side through the transparent substrate fixation plate 110 made of quartz.

Figure 23:
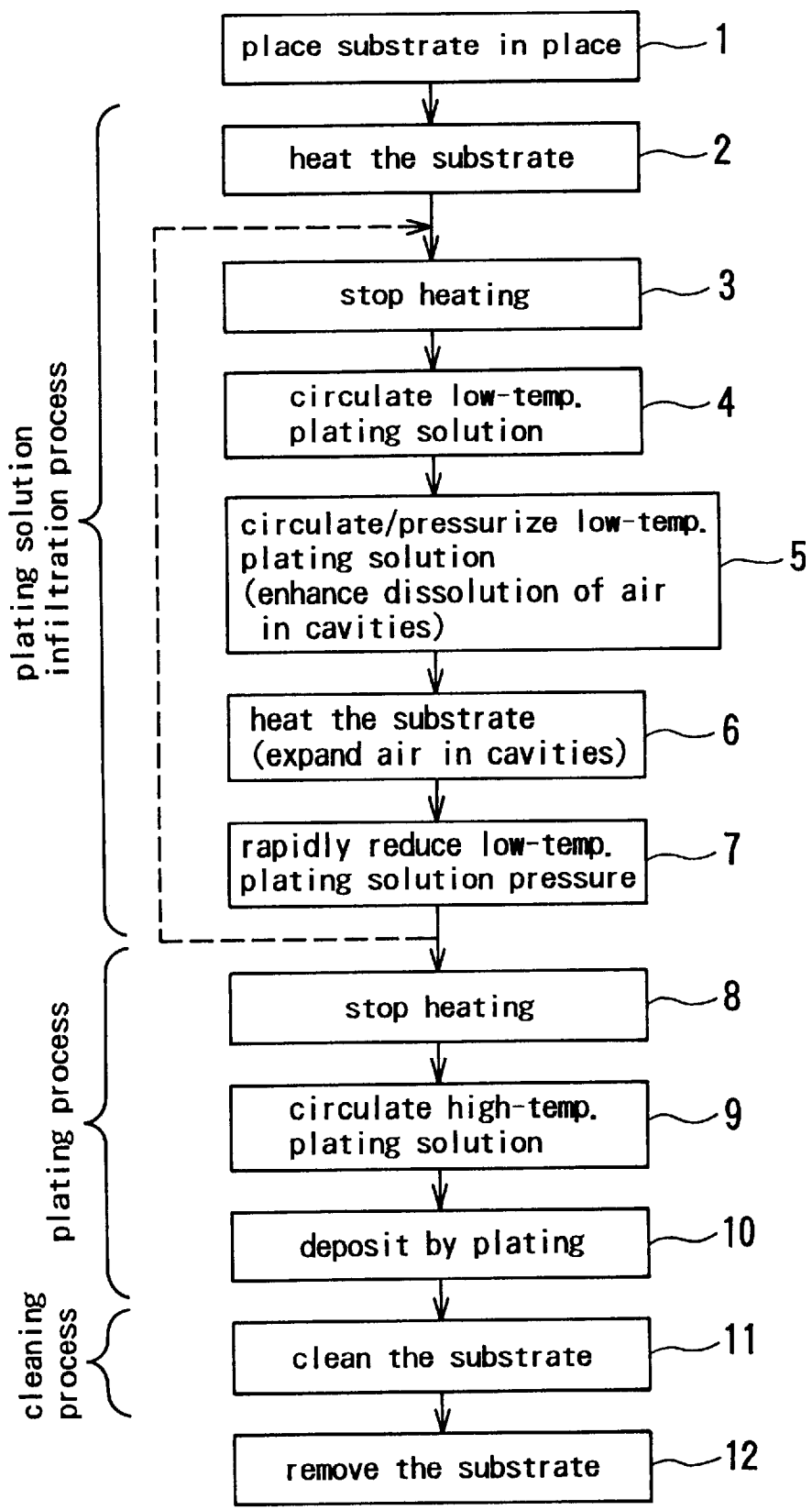
FIG. 23 is a flowchart for plating process steps for a process in FIG. 22.

FIG. 23 is a flowchart showing operational procedures for the plating apparatus described above. Operational steps will be explained with reference to FIGS. 22 and 23. First, the back surface of the substrate w not having the cavities C is placed in the depression section 111 to face the fixation plate 110, and is aspirated through the holes 112 to be vacuum chucked in the depression section 111. The cap section 120 is placed to cover the opposite fabricated surface of the substrate W and pressed against the packing 129 by means of a clamp device (not shown) (step 1). The fabricated surface of the substrate W is thus exposed to the sealed liquid holding space 121. In this condition, the valves 141, 143, 181, 183, 185 and 187 are all closed.

Next, the substrate W is heated from its back surface by means of the substrate heating device 170 to warm the substrate W to about 110° C. for example.

Next, heating is stopped (step 3), and the valves 141, 185, 183 are opened and the pump 166 is operated, so as to fill the liquid holding space 121 with the plating solution from the low temperature chamber 163 and, thereafter, circulate the low-temperature solution (step 4). The flow rate of the circulating liquid should be such as to replace residual air within the cap section 120 with the plating solution effectively, but not so large to cause flow resistance and foaming. The reason for choosing low temperature (room temperature) for the electroplating solution is to increase solubility of air in the solution (solubility of gas increases in general with low temperature and high pressure of a system). In the case of electroless plating, the substrate W is kept at a temperature insufficient for plating in this step. When the substrate W is heated by the heating device 170 in step 6 (to be described later), and if there is a danger of electroless plating of the substrate W, the plating solution is kept free of any catalyst in this stage.

The fabricated surface of the substrate W comes into contact with the plating solution by the steps taken so far, but some of the cavities C will still contain some residual air. The plating solution is at atmospheric pressure in this stage.

Next, pump 166 is operated while closing the valve 185 so that the plating solution inside the liquid holding space 121 will be pressurized to about 20 kgf/cm$^2$ by the pressurization control valve 150 (step 5). Pressurization causes the residual air inside the cavities C to be compressed to facilitate dissolution into the plating solution, thereby reducing the residual air.

While leaving the apparatus in this condition, the substrate W is heated by the heating device 170 to about 100° C. to expand the residual air inside the cavities C (step 6). Some of the residual air will be expelled outside of the cavities C at this stage.

In this embodiment, the lamp heater is used for the substrate heater device 170 so that only the back surface of the substrate W will be heated rapidly through the transparent quartz plate 110, while the surface can be quickly cooled by turning off the lamp. Therefore, the present method is more advantageous, compared with heating the substrate W with the fixation plate 110 itself, because the heating/cooling needs of the substrate w can be met very quickly. Thus, this method is not only compatible with other treatments such as pressure changes, but avoids any danger of extending the heating to the solution inside the space 121, which may cause undesirable plating.

Next, valve 185 is opened to quickly reduce the pressure inside the space 121 (step 7) from a pressure at 10 kgf/cm$^2$ to normal pressure, for example. This treatment causes the residual air, trapped in the cavities C at high temperature and pressure, to be rapidly expanded and expelled out and be replaced with the plating solution flowing in and filling the cavities C.

The above steps 2~7 represent a plating solution infiltration process, but if one such treatment is not sufficient to fill in the cavities C with the plating solution, the process can be repeated by returning to step 3.

Next, the operation moves from the solution infiltration stage to the plating stage. First, the substrate heating device 170 is turned off (step 8), and the pump 166 is stopped and valve 183 is closed. The other pump 165 is operated and valve 181 is opened, thereby circulating the high temperature plating solution inside the liquid holding space 121 (step 9). The pressure inside the liquid holding space 121 is kept at about atmospheric pressure. The flow rate of circulating liquid is controlled to provide a plating solution flow of a uniform speed over the substrate W and not to affect the flow resistance. The solution temperature is controlled by the heater 162.

If the plating process is electroless plating, the fabricated surface of substrate W is plated with copper at this stage. If the process is electrolytic plating, an electric field is applied between the substrate W and the anode 123 to carry out plating of the substrate W.

Electroplating solution may be an aqueous solution containing $CuSO_4.5H_2O$ and sulfuric acid, additives and chloride ions, while electroless plating solution may be, for example, an aqueous solution containing $CuSO_4.5H_2O$ and ethylenediaminetetraacetic acid tetrasodium salt (EDTA.4Na), tetramethylammonium hydroxide (TMAH) and formalin.

After plating for a given period (step 10), pump 165 is stopped and valves 141, 181 are closed and valves 143 and 187 are opened to supply pure water to the space 121 to replace plating solution to clean the surface of the substrate W (step 11). Next, leaning solution is discharged from the space 121 and the substrate W is removed (step 12).

Figure 27A:
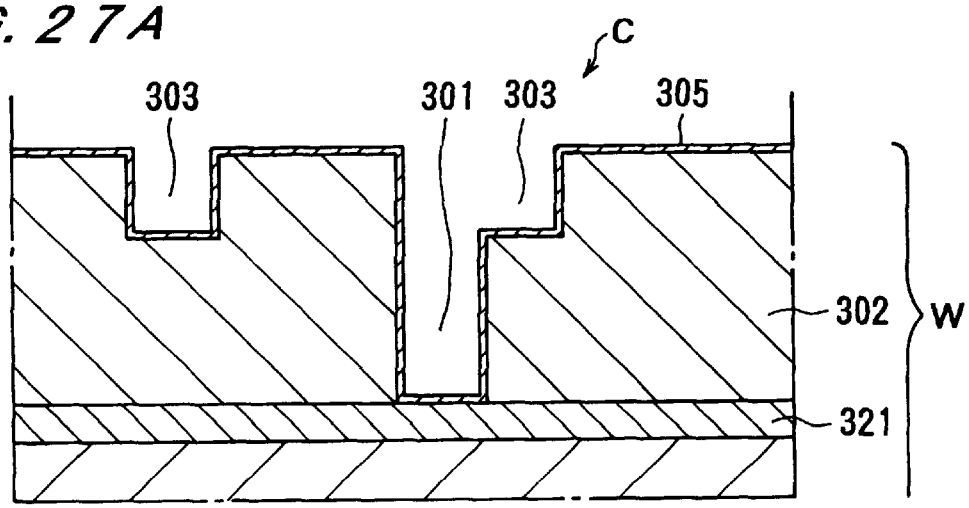
FIG. 27 is an illustration of bubbles remaining in a micro-cavity on a substrate immersed in liquid.
Figure 27B:
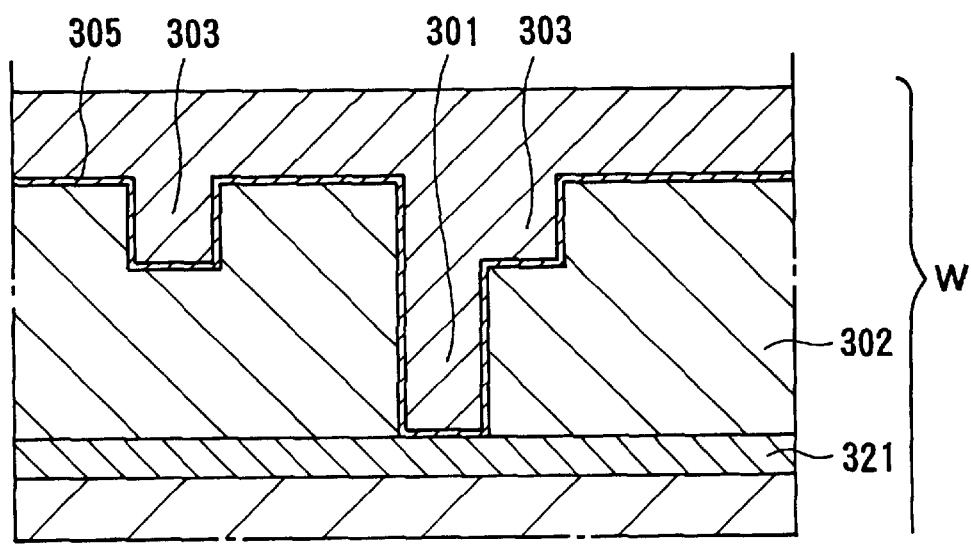
Figure 27C:
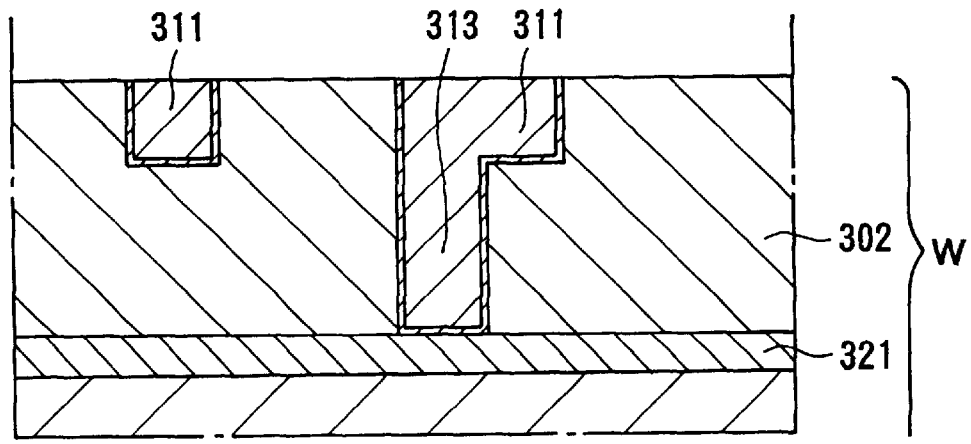

The substrate W thus plated according to the various embodied methods presented above is illustrated in FIG. 27B, which shows that the cavities C on the substrate surface (wiring grooves 303 and contact holes 301 in FIG. 27) are plated. Plated substrate W is further processed by chemical mechanical polishing (CMP) to leave plated metal inside the cavity C, and remove all other plated deposit on the surface, to thereby produce wiring 311 and plugs 313 shown in FIG. 27C. In the illustration, 302 designates a $SiO_2$ insulation film, 306 a barrier layer and 321 a conductive layer.

The embodiments have been explained in detail above, but the present invention may be embodied in various modified form as explained below.

a) In the embodiments, residual air is first placed under heat and pressure, and by rapidly reducing the pressure, residual air is rapidly expelled out of the cavities, but in some cases, only heating may be employed without pressurization so that expansion due to heating may be sufficient to expel residual air out of the cavities. Conversely, the treatment process may be comprised by cyclic application of pressure/normal pressure steps without involving any heating step to drive off residual air from the cavities.

b) In the above embodiment, copper plating was used to plate a semiconductor wafer, but other metal plating may also be used.

c) In the above embodiments, a plating process is applied to semiconductor wafer as the substrate material, but it is obvious that a plating solution or other types of liquid may be infiltrated into similar cavities formed on other types of substrate materials.

d) In the above embodiments, all of one surface of the substrate W was made to contact a liquid substance, however, the present invention is applicable so long as the fine cavity portion formed on a substrate material is exposed to the liquid. It is permissible to expose both surfaces of a substrate W to the liquid substance.

e) In the above embodiments, a lamp heater was used as a substrate heating device, but other types of heating device or structures can be applied for the same purpose, and the location of the heating device is not limited to the back side of a substrate W.

FIG. 24 is a schematic overall view of a plating apparatus for a semiconductor wafer. The apparatus is comprised by a pressure vessel 210 containing a substrate W with the outer periphery fixed in place, a gas filling device 240, a vacuum device 250, an exhaust device and a liquid pressuring device 260. Each of these components will be explained below.

The pressure vessel 210 is comprised by two roughly circular cover plates 211, 221. These cover plates 211, 221 respectively have a spherical protrusion in the center region and outer annular peripheral sections 215, 225. These cover plates 211, 221 form the pressure vessel 210 by joining them so that the outer annular peripheral sections 215, 225 are intimately mated to each other.

In the center of the cover plate 211 is a port 214 for connecting the gas filling device 240, and in the center of the cover plate 221 is a port 224 for connecting the vacuum device 250, both of which are described later in detail. There are also two ports 231, 233 provided in certain locations of the cover plate 211 for connecting liquid pressuring device 260.

Clamping sections 211a, 225a are provided in the inner edges of both of the peripheral sections 215, 225 for clamping a substrate W therebetween when the cover plates 211, 221 are joined together, thereby forming two sealed spaces 211a, 221a. The peripheral sections 215, 225 are provided with a plurality of transfer routes 216, 223 for communicating between the two spaces 11a, 21a. In a certain location of the peripheral section 225, a port 226 communicated to the transfer routes 216, 223 is provided for connecting a pipe 291 for an air release valve 290. A packing 235 is provided for sealing between the outer peripheral sections 215, 225.

Gas filling device 240 comprises a gas supply source 241 such as gas cylinder, and piping 243 having a valve 245 and connected to the pressure vessel 210 through the port 214 of the cover plate 211. Gas, in this case, is a type that can readily dissolve in the plating solution.

Vacuum device 250 also comprises a vacuum pump 251 connected to the port 224 of the cover plate 221 through piping 253 and a valve 255.

Liquid pressuring device 260 is comprised by: a plating solution tank 261; piping 271 connecting the plating solution tank 261 to pressure vessel 210 at the port 231 through a pump 263, a valve 265, a regulator 267 a valve 269; and piping 275 connecting the plating solution tank 261 to the upstream side of the valve 269 of the piping 271 through a valve 273; and piping 281 connecting the plating solution tank 261 and a port 233 of the pressure vessel 210 through a valve 277 and a pump 279.

Electroplating solution in the plating solution tank 261 may be an aqueous solution containing $CuSO_4 \cdot 5H_2O$ and sulfuric acid, additives and chloride ions, while electroless plating solution may be, for example, an aqueous solution containing $CuSO_4 \cdot 5H_2O$ and ethylenediaminetetraacetic acid tetrasodium salt (EDTA.4Na), tetramethylammonium hydroxide (TMAH) and formalin.

Figure 25:
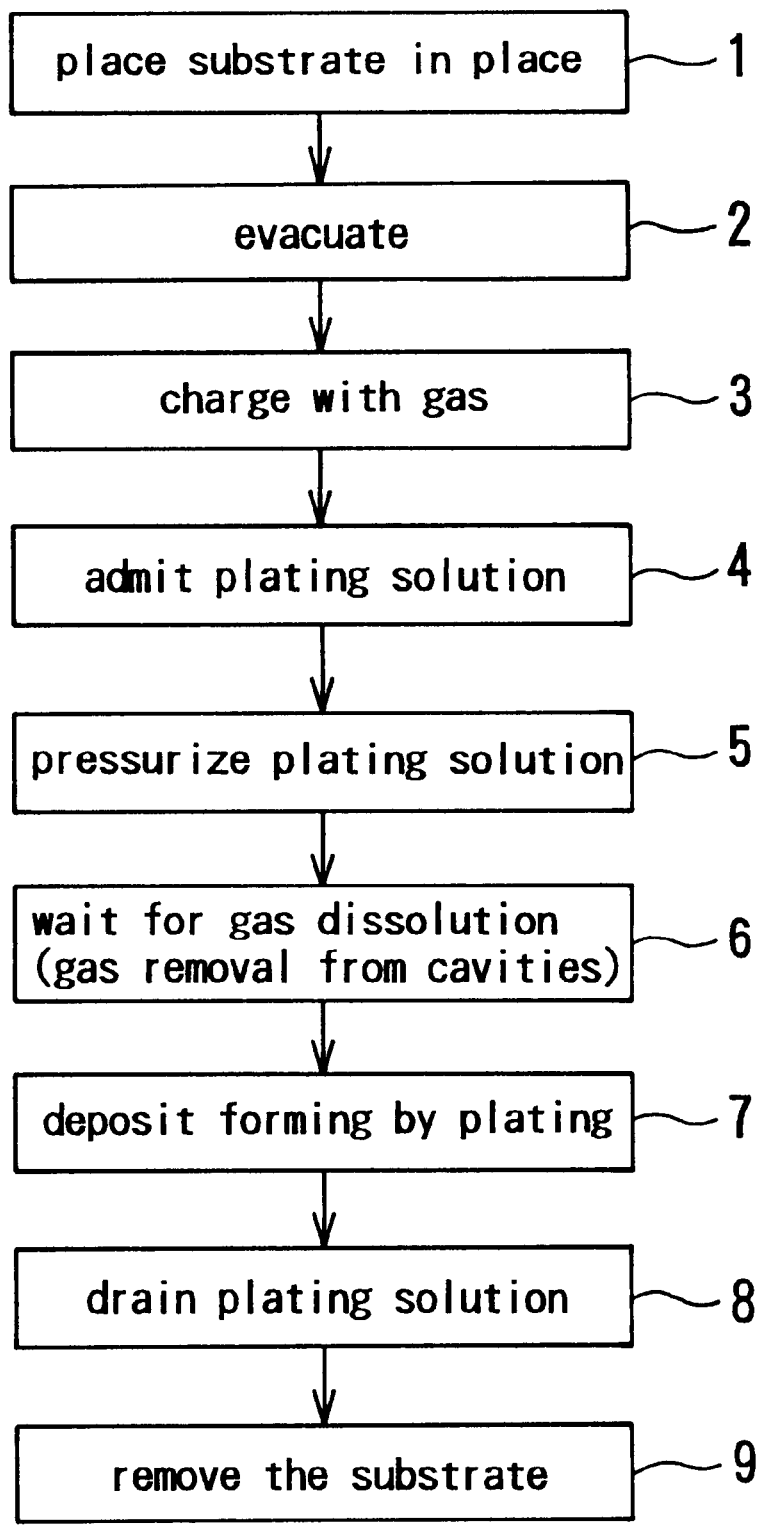
FIG. 25 is a flowchart for steps for the plating apparatus shown in FIG. 24.
Figure 26:
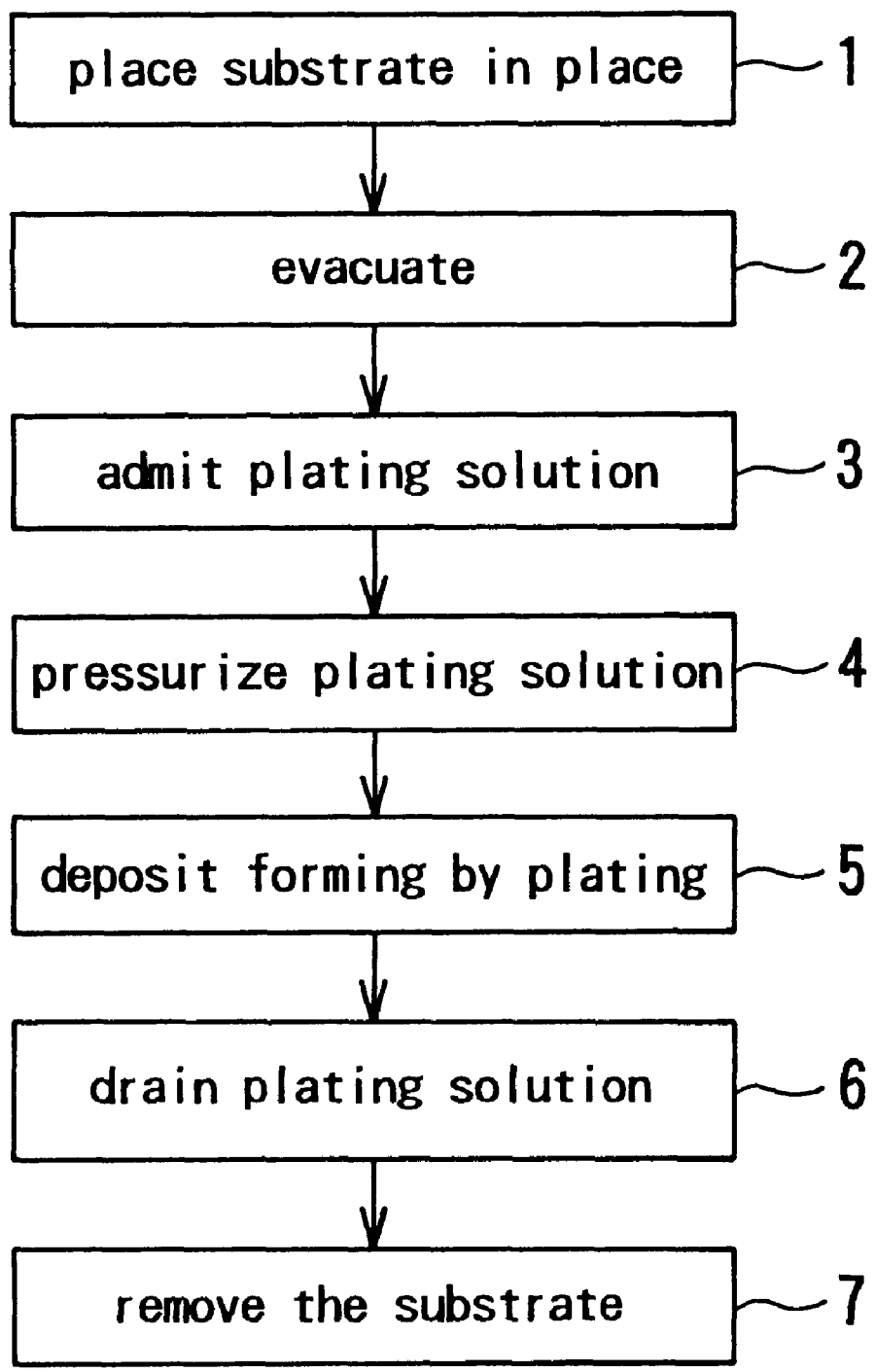
FIG. 26 is another flowchart for the plating apparatus shown in FIG. 24.

FIGS. 25, 26 are flowcharts for processes using the plating apparatus described above. Each process given in these flowcharts may be carried out separately but they can also be used continually.

First, the steps in FIG. 25 will be explained. A substrate W with cavities C is placed in one of the cover plates 211, 221. By joining the cover plates 211, 221 together, the peripheral portion is clamped by the clamping sections 15a, 25a of the peripheral sections 215, 225, and two sealed spaces 211a, 221a are formed on both sides of the substrates. The piping 243, 253, 271, 281, 291 are connected to respective ports of the pressure vessel 10 (step 1). Initially, the valves 245, 255, 265, 269, 273, 277, 290 are closed.

Next, the pressure vessel 210 is evacuated by opening the valve 255 and operating the pump 251 (step 2). This step removes residual air from the cavities C.

Next, a gas is introduced into the pressure vessel 210 while closing the valve 255 and opening valve 245 (step 3). In this step, the cavities C which are evacuated can be readily filled with the gas. If the cavities C are of sufficient size that can be filled without evacuating, this step may be omitted.

Next, the plating solution is introduced into the pressure vessel 210 while closing the valve 245, opening the two valves 265, 269 and operating the pump 263 concurrently (step 4). In this case, air in the vessel 210 is removed by opening the valve 290. This step wets the surface of the substrate W with the plating solution, but some residual gas may be left in the cavities C because of the surface tension of the gas.

After filling the interior of the pressure vessel 210 with the plating solution, valve 290 is closed, and the pump 263 is continued to be operated to pressurize the liquid in the vessel 210 to a high pressure (step 5). Pressurization is continued to reach a value set by the pressure regulator 267 (in this embodiment, about 30 kgf/cm$^2$).

The pressurization is maintained for a predetermined time (step 6). In this step, residual gas in the cavities C is readily dissolved in the plating solution, because of two reasons: first is that the gas is a type that can dissolve in the plating solution and the second is that the system is compressed to a high pressure. Thus, the cavities C are filled with plating solution.

If the process is an electroless plating, the surface of the substrate W is plated with copper by holding the plating solution at a certain temperature. If the process is an electroplating process, an electric field is applied between the substrate W and an anode to carry out plating (step 7). In either case, because the cavities C are filled with the plating solution, copper plating deposit can reliably be formed inside the cavities C.

After closing the valves 265, 269, pump 263 is stopped, valve 277 is opened and pump 279 is operated to discharge the plating solution (step 8), the substrate W can be taken out of the pressure vessel 210 (step 9).

Operating steps for another operation method for the plating apparatus is shown in FIG. 26 which will be explained next. Similar to the steps shown in FIG. 25, after placing the substrate W in the pressure vessel 210 (step 1), valve 255 is opened and pump 251 is operated to evacuate the vessel 210 (step 2). In this step, residual air in the cavities C is removed.

Next, by closing the valve 255 and opening the two valves 269, 273, the plating solution is introduced into the pressure vessel 210 (step 3). In this step, the surface of the substrate W is wetted with the plating solution and the cavities C are filled with the plating solution because the vessel is evacuated.

Next, valve 273 is closed, the valve 265 is opened and the pump 263 is operated to pressurize the plating solution in the vessel 210 to a high pressure (step 4). Pressurization is continued to reach a value controlled by the pressure regulator 267 (in this embodiment, about 30 kgf/cm$^2$).

In this case, although the plating solution infiltrates the cavities C because the system is evacuated, if the evacuation is not complete, residual gas may remain in the cavities C. In such a case, by holding the pressure on the plating solution, residual air is highly compressed and dissolved in the plating solution so that the cavities C can be filled with the plating solution.

Here, using either an electroless or electroplating process, copper is plated on the surface of the substrate W (step 5). Because the cavities C are filled with the plating solution, copper is reliably plated inside the cavities C.

Next, by closing the valves, 265, 269 and stopping the pump 263, and opening the valve 277 and operating the pump 279, the plating solution is discharged from the vessel 210 (step 6) and the substrate W is taken out of the vessel 210 (step 7).

As explained above, although the steps shown in FIGS. 25, 26 may be carried out separately, they may be carried out continually as one series of processing operations. That is, after carrying out the steps 1~5 shown in FIG. 25, the plating solution is removed without performing any plating (skip step 6 and do step 7), next, perform steps 2 to 7 shown in FIG. 26.

By following such a sequence of steps, the cavities filled with the plating solution by the operations carried out to step 5 in FIG. 25 will retain the liquid in the cavities even when exposed to a vacuum environment because air bubbles are not contained in the cavities. On the other hand, if filling is inadequate that there are some bubbles remaining in the cavities C, such bubbles are removed when the substrate W is subjected to evacuation in step 2 in FIG. 26. The overall result is that the cavities C can be filled with the plating solution in the steps to follow, and all the cavities C can thus be filled with the plating solution, thus reliably forming a plating deposit inside the cavities C.

It should be noted that although various embodiments are based on performing pre-plating treatment and plating processes in separate vessels or in the same vessel, such a choice may be made individually in any combination unless there are fundamental reasons for choosing one case over the other.

What is claimed is:

1. A method for producing a metal deposit inside micro-cavities fabricated on a substrate, said method comprising:

immersing the substrate in a liquid held in a plating chamber;

heating the liquid in the plating chamber so as to heat the substrate and remove residual bubbles from the micro-cavities on the substrate; and plating the substrate in the plating chamber so as to produce a metal deposit inside the microcavities.

2. The method of claim 1, wherein said heating is carried out periodically or continuously.

3. The method of claim 1, wherein said plating is carried out with a plating solution in the plating chamber, the plating chamber having a heater provided therein for controlling the temperature of the plating solution, and further comprising controlling the temperature of the plating solution during said plating.

4. The method of claim 1, wherein said plating is carried out with a plating solution in the plating chamber, the plating chamber having a heater provided therein for controlling the temperature of the plating solution and a vibrating device for vibrating the plating solution in the processing chamber, and further comprising controlling vibrations of the plating solution during said plating.

5. A method of fabricating wiring on a substrate, comprising:

immersing the substrate in a liquid in a plating chamber;

heating the substrate in the plating chamber so as to remove residual bubbles from micro-cavities on a surface of the substrate and to degas within the micro-cavities;

plating the substrate in the plating chamber so as to produce a metal deposit in the micro-cavities on the surface of the substrate; and removing unwanted portions of metal deposit formed on the substrate by polishing using a chemical and mechanical polishing device.

6. A method for producing a metal deposit inside micro-cavities fabricated on a substrate, said method comprising:

disposing the substrate in a vessel;

filling the vessel with a condensable gas;

cooling the substrate below the dew point of the condensable gas so as to condense the gas into condensed liquid;

replacing the condensed liquid with a plating solution; and plating the substrate so as to produce a metal deposit inside the micro-cavities.

7. The method of claim 6, and further comprising vibrating the substrate.

8. The method of claim 7, wherein said step of filling the vessel with a condensable gas comprises varying the charging pressure of the condensable gas.

9. The method of claim 7, wherein said filling the vessel with a condensable gas comprises varying the charging pressure of the condensable gas.

10. The method of claim 7, and further comprising immersing the substrate in a solution.

11. The method of claim 10, wherein said immersing comprises immersing the substrate in a solution that has been degassed by boiling or evacuating.

12. The method of claim 7, and further comprising immersing the substrate in a solution.

13. The method of claim 12, wherein said immersing comprises immersing the substrate in a solution that has been degassed by boiling or evacuating.

14. The method of claim 9, and further comprising immersing the substrate in a solution.

15. The method of claim 14, wherein said immersing comprises immersing the substrate in a solution that has been degassed by boiling or evacuating.

16. A method for producing a metal deposit inside micro-cavities fabricated on a substrate, said method comprising:

contacting a plating liquid to a surface of the substrate having micro-cavities fabricated thereon;

heating the substrate so as to expel residual bubbles from the micro-cavities by inflation; and introducing the plating liquid into the micro-cavities and plating within the micro-cavities with the plating liquid.

17. The method of claim 16, wherein said heating of the substrate so as to expel residual bubbles is performed concurrently with periodic pressurizing and depressurizing of the plating liquid between a pressurized state and an unpressurized state.

18. The method of claim 16, wherein said heating of the substrate so as to expel residual bubbles is performed such that:

the plating liquid is initially pressurized;

the plating liquid is then depressurized so as to inflate air bubbles to be expelled from the micro-cavities; and the plating liquid is introduced into the micro-cavities.

19. A method of producing a metal deposit inside micro-cavities fabricated on a substrate, said method comprising:

placing at least a part of the substrate having the micro-cavities fabricated thereon in a plating chamber;

covering the part of the substrate having the micro-cavities fabricated thereon with a plating liquid in the plating chamber;

heating the plating liquid in the plating chamber so as to heat the substrate and remove residual bubbles from the micro-cavities on the substrate; and plating the substrate in the plating chamber so as to produce a metal deposit inside the micro-cavities.

20. A method of fabricating wiring on a substrate, comprising:

covering a part of the substrate with a plating liquid in a plating chamber;

heating the plating liquid in the plating chamber so as to heat the substrate and remove residual bubbles from micro-cavities on a surface of the substrate and to degas within the micro-cavities;

plating the substrate in the plating chamber so as to produce a metal deposit in the micro-cavities on the surface of the substrate and thereby form wiring; and removing unwanted portions of the metal deposit formed on the substrate by polishing using a chemical and mechanical polishing device.

21. A method for producing a metal deposit inside micro-cavities fabricated on a substrate, comprising:

covering a part of a surface of the substrate having the micro-cavities fabricated thereon with a plating liquid;

heating the substrate so as to expel residual bubbles from the micro-cavities by inflation; and introducing the plating liquid into the micro-cavities and producing a metal deposit in the micro-cavities.

22. A method for producing a metal deposit inside micro-cavities fabricated on a substrate, said method comprising:

immersing said substrate in a liquid held in a processing chamber;

evacuating said processing chamber so as to remove residual bubbles from said micro-cavities and to degas said liquid within said micro-cavities; and subjecting said liquid to boiling in at least those regions adjacent to said substrate.

23. A method according to claim 22, wherein said liquid comprises a plating solution.

24. A method according to claim 22, further comprising replacing said liquid with a plating solution.

25. A method according to claim 22, wherein said processing chamber is a plating chamber.

26. A method according to claim 22, wherein said processing chamber is a pre-plating processing chamber.

27. A method according to claim 22, wherein, in said boiling, interior chamber pressure is reduced to less than a saturated vapor pressure of said liquid.

28. A method according to claim 22, wherein, in said boiling, said substrate is heated from a back surface of said substrate.

29. A method according to claim 22, wherein, between said evacuating and said boiling interior chamber pressure is raised.

30. A method according to claim 29, wherein said boiling and said pressurizing are repeatedly carried out.

31. A method according to claim 22, wherein said boiling is carried out while performing plating.

32. A method for fabricating wiring on a substrate comprising:

immersing said substrate in a liquid in a processing chamber;

evacuating said processing chamber so as to remove residual bubbles from said micro-cavities and to degas said liquid within said micro-cavities;

subjecting said liquid to boiling in at least those regions adjacent to said substrate;

plating said substrate so as to produce a metal deposit inside said micro-cavities; and removing unwanted portions of metal deposit formed in said micro-cavities by polishing using chemical and mechanical polishing methods.

33. A method according to claim 32, further comprising, between said boiling and plating, replacing said liquid with a plating solution.

* * * * *